United States Patent
Manabe et al.

[11] Patent Number: 6,060,717
[45] Date of Patent: May 9, 2000

[54] CHARGED PARTICLE BEAM EXPOSURE METHOD AND CHARGED PARTICLE BEAM EXPOSURE APPARATUS THEREFOR

[75] Inventors: Yasuo Manabe; Hiromi Hoshino; Yasuhide Machida, all of Kawasaki, Japan

[73] Assignee: Fujitsu Limited, Kawasaki, Japan

[21] Appl. No.: 09/139,767

[22] Filed: Aug. 25, 1998

[30] Foreign Application Priority Data

Feb. 17, 1998 [JP] Japan ................................ 10-034520

[51] Int. Cl.$^7$ .................................................. H01J 37/302
[52] U.S. Cl. ...................................................... 250/492.22
[58] Field of Search ................................ 750/492.22, 398

[56] References Cited

U.S. PATENT DOCUMENTS 5,955,738  9/1999  Manabe et al. .................... 250/492.22

Primary Examiner—Kiet T. Nguyen
Attorney, Agent, or Firm—Staas & Halsey

[57] ABSTRACT

The present invention relates to a charged particle beam exposure method, wherein exposure data having exposure pattern data for each of a plurality of sub-fields located in a main field are acquired from pattern data for each of the sub-fields and a sample is exposed in accordance with the exposure data. The method comprises the steps of: forming a plurality of areas having different shapes, in accordance with patterns in the sub-fields, and acquiring pattern densities in the areas; correcting the pattern densities in accordance with pattern densities for areas surrounding the areas and with distances between the areas; generating auxiliary exposure patterns in the areas when the pattern densities for the areas are lower than a predetermined reference exposure density; and exposing the sample in accordance with the exposure data obtained by adding the data for the auxiliary exposure patterns to the pattern data. According to the present invention, a variable area can be formed, the number of areas can be reduced, and data processing can be performed more efficiently.

14 Claims, 27 Drawing Sheets

EXPOSURE DATA CREATING DEVICE

ELECTRON BEAM EXPOSURE APPARATUS

MAIN FIELD MF AND SUB-FIELD SF

EXAMPLE OF DESIGN DATA $$\Delta S33 = \sum_{m,n=1}^{5} Smn \times \beta\,(r(amn-a33))$$

SRmn = Smn + Δ Smn

FIG. 10

20 CORRECTION TABLE

| STAGE | PATTERN DENSITY SRmn(%) | SUPPLEMENTARY EXPOSURE PATTERN GENERATION | CORRECTION RATIO α FOR CORRECTION |
|---|---|---|---|
| 1 | 0.0 ~ 9.5 | SUPPLEMENTARY EXPOSURE 1 | 1.0 |
| 2 | 9.5 ~ 18.5 | SUPPLEMENTARY EXPOSURE 2 | 1.0 |
| 3 | 18.5 ~ 27.5 | SUPPLEMENTARY EXPOSURE 3 | 1.0 |
| 4 | 27.5 ~ 36.5 | SUPPLEMENTARY EXPOSURE 4 | 1.0 |
| 5 | 36.5 ~ 45.5 | SUPPLEMENTARY EXPOSURE 5 | 1.0 |
| 6 | 45.5 ~ 54.5 | NO SUPPLEMENTARY EXPOSURE | 1.0 |
| 7 | 54.5 ~ 63.5 | NO SUPPLEMENTARY EXPOSURE | 0.8 |
| 8 | 63.5 ~ 72.5 | NO SUPPLEMENTARY EXPOSURE | 0.6 |
| 9 | 72.5 ~ 81.5 | NO SUPPLEMENTARY EXPOSURE | 0.4 |
| 10 | 81.5 ~ 90.5 | NO SUPPLEMENTARY EXPOSURE | 0.2 |
| 11 | 90.5 ~ 100.0 | NO SUPPLEMENTARY EXPOSURE | 0.1 |

EXAMPLE OF EXPOSURE DATA

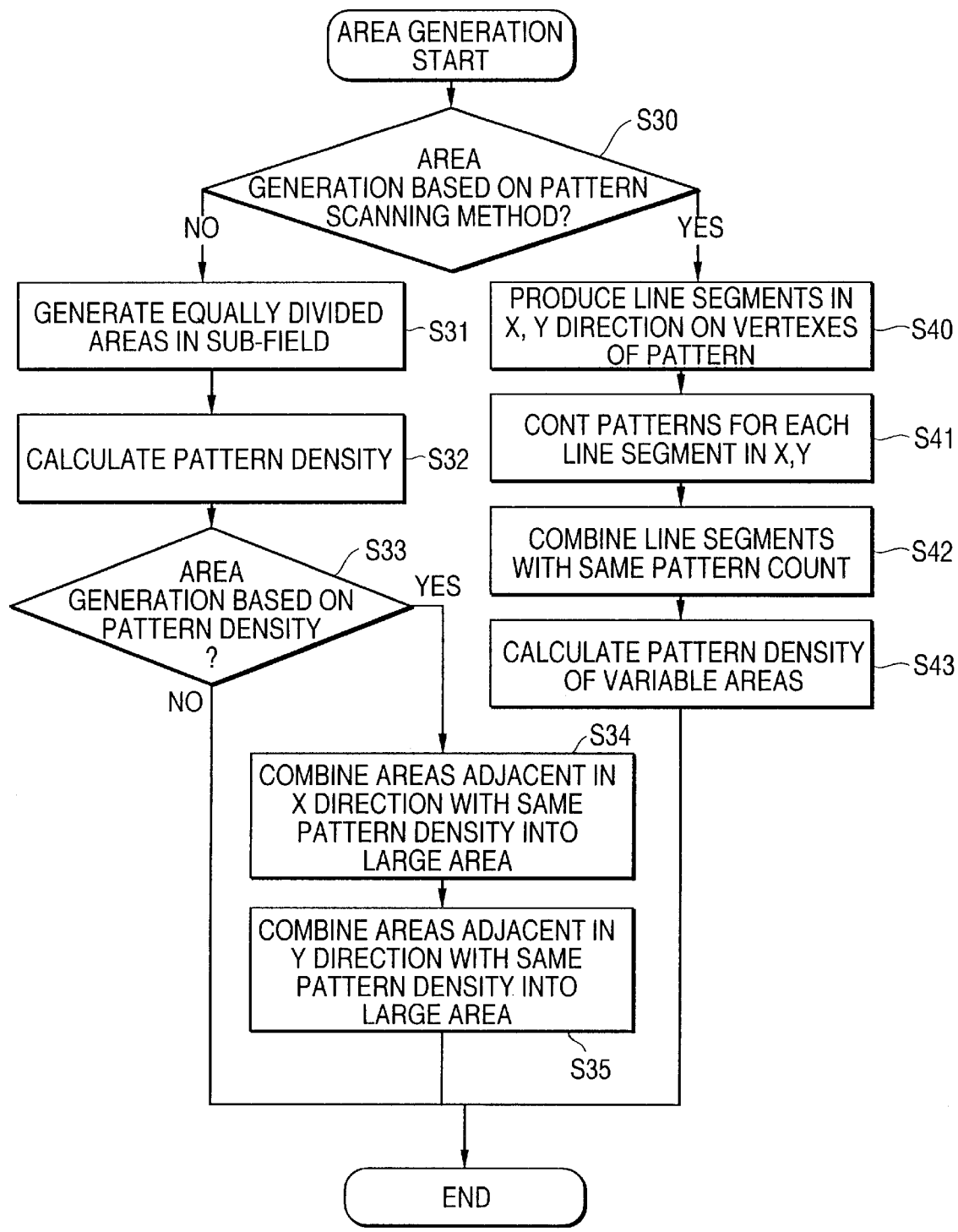

FIG. 14A

| 25.0 | 25.0 | 25.0 | 25.0 | 25.0 | 25.0 | 25.0 | 25.0 |
|---|---|---|---|---|---|---|---|
| 25.0 | 25.0 | 50.0 | 50.0 | 50.0 | 50.0 | 25.0 | 25.0 |
| 25.0 | 25.0 | 50.0 | 50.0 | 40.0 | 40.0 | 40.0 | 25.0 |
| 25.0 | 25.0 | 40.0 | 40.0 | 40.0 | 40.0 | 40.0 | 25.0 |
| 25.0 | 30.0 | 30.0 | 30.0 | 25.0 | 25.0 | 40.0 | 25.0 |
| 25.0 | 30.0 | 30.0 | 30.0 | 25.0 | 25.0 | 40.0 | 25.0 |
| 25.0 | 30.0 | 30.0 | 25.0 | 25.0 | 25.0 | 40.0 | 25.0 |
| 25.0 | 25.0 | 25.0 | 25.0 | 25.0 | 25.0 | 25.0 | 25.0 |

→ SUB-FIELD SF
→ AREA amn
— 400

↓ REPLACED BY LARGER AREA IN X DIRECTION

FIG. 14B

| 25.0 | 25.0 | 25.0 | 25.0 | 25.0 | 25.0 | 25.0 | 25.0 |
|---|---|---|---|---|---|---|---|
| 25.0 | 25.0 | 50.0 | 50.0 | 50.0 | 50.0 | 25.0 | 25.0 |
| 25.0 | 25.0 | 50.0 | 50.0 | 40.0 | 40.0 | 40.0 | 25.0 |
| 25.0 | 25.0 | 40.0 | 40.0 | 40.0 | 40.0 | 40.0 | 25.0 |
| 25.0 | 30.0 | 30.0 | 30.0 | 25.0 | 25.0 | 40.0 | 25.0 |
| 25.0 | 30.0 | 30.0 | 30.0 | 25.0 | 25.0 | 40.0 | 25.0 |
| 25.0 | 30.0 | 30.0 | 25.0 | 25.0 | 25.0 | 40.0 | 25.0 |
| 25.0 | 25.0 | 25.0 | 25.0 | 25.0 | 25.0 | 25.0 | 25.0 |

↓ REPLACED BY LARGER AREA IN Y DIRECTION

FIG. 14C

| 25.0 | 25.0 | 25.0 | 25.0 | 25.0 | 25.0 | 25.0 | 25.0 |
|---|---|---|---|---|---|---|---|
| 25.0 | 25.0 | 50.0 | 50.0 | 50.0 | 50.0 | 25.0 | 25.0 |
| 25.0 | 25.0 | 50.0 | 50.0 | 40.0 | 40.0 | 40.0 | 25.0 |
| 25.0 | 25.0 | 40.0 | 40.0 | 40.0 | 40.0 | 40.0 | 25.0 |
| 25.0 | 30.0 | 30.0 | 30.0 | 25.0 | 25.0 | 40.0 | 25.0 |
| 25.0 | 30.0 | 30.0 | 30.0 | 25.0 | 25.0 | 40.0 | 25.0 |
| 25.0 | 30.0 | 30.0 | 25.0 | 25.0 | 25.0 | 40.0 | 25.0 |
| 25.0 | 25.0 | 25.0 | 25.0 | 25.0 | 25.0 | 25.0 | 25.0 |

— amn amn

FIG. 15

EXAMPLE OF AREA DATA

SFmn
- a11: x1,y1
- a11: x1,y2
- a11: x1,y3
- ⋮
- a11: x1,yj

AREA DATA
- a11: x1,y1
- POSITION OF EXISTING PATTERN
  LEFT BELOW: x,y
  RIGHT ABOVE: x,y
- PATTERN DENSITY
- CORRECTED DENSITY
- FLAG OF AUXILIARY
- FLAG OF MSF
- QUANTITY OF EXPOSURE REDUCTION RATE 14 x 16 = 224 AREAS   RETRIEVED REGION 400

FLOWCHART OF AREA CORRECTION PROCESSING

CORRECTED PATTERN DENSITY AND AUXILIARY EXPOSURE PATTERN

EXAMPLE USING BLOCK MASK AUXILIARY EXPOSURE PATTERN

FLOWCHART FOR PROCESSING OF BLOCK MASK

FIG. 25
MINIMUM LINE WIDTH SELECTION TABLE FOR BLOCK MASK PATTERN DATA
| W1 | 0.18 μm |
|----|---------|
| W2 | 0.20 μm |
| W3 | 0.22 μm |
| W4 | 0.24 μm |
| W5 | 0.26 μm |
FIG. 26A
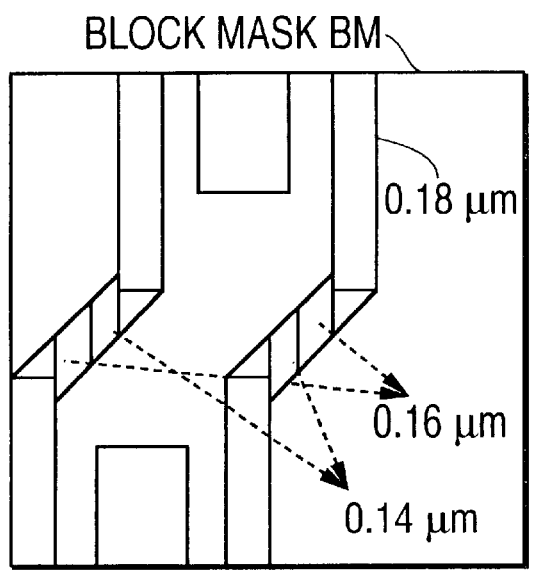
FIG. 26B
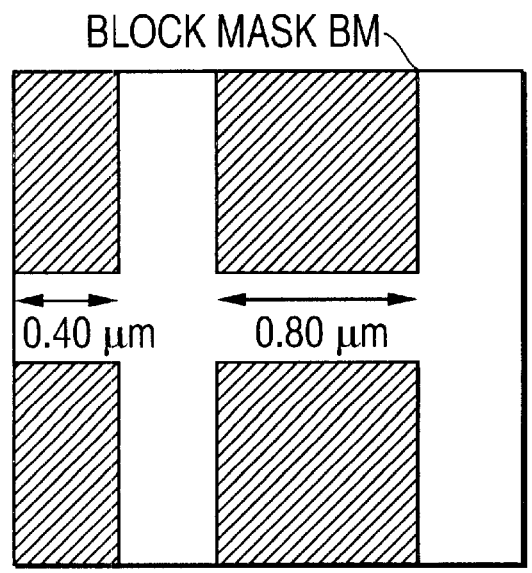

PATTERN DATA IN BLOCK MASK

▨ EXTRACTED PATTERN DATA HAVING MINIMUM LINE WIDTH

☐ NOT EXTRACTED PATTERN DATA

EXAMPLE OF EXPOSURE DATA INCLUDING BLOCK MASK DATA

CHARGED PARTICLE BEAM EXPOSURE METHOD AND CHARGED PARTICLE BEAM EXPOSURE APPARATUS THEREFOR

BACKGROUND OF THE INVENTION

1. Field of the Invention

The present invention relates to a charged particle beam exposure method and a charged particle beam exposure apparatus therefor, and in particular to a method for producing exposure data used for employing a charged particle beam, such as an electron beam, to expose a semiconductor wafer in order to form a pattern thereon, and to an apparatus therefor.

2. Related Arts

Sub-micron patterns can be formed by the irradiation of charged particle beams, such as electron beams, and such beams are employed in the manufacturing process for highly integrated LSIs. In particular, not only the charged particle beams are employed for the manufacture of masks, but the beams are also used to directly irradiate, and thus expose, resists formed on semiconductor wafers.

In the LSI design process, data for a pattern having a plurality of layers are produced to form a desired integrated circuit. In accordance with such pattern data, exposure of a resist on a semiconductor wafer or on a mask substrate is performed. During the exposure process, a resist film is irradiated by a charged particle beam in order to use the energy of the beam to induce a chemical reaction on the surface of the resist.

In this case, consideration must be given to the proximity exposure effect, which is due to the forward beam scattering and the rearward beam scattering which occur when a resist is irradiated by a charged particle beam. The proximity exposure effect is a phenomenon whereof when a charged particle beam is employed to irradiate a specific area, beam scattering causes the energy of the beam to spread to adjacent areas. For example, in a region having a high exposure pattern density, a developed pattern is expanded due to the energy of a charged particle beam which is projected onto areas adjacent to an exposure pattern. In a region having a low exposure pattern density, adjacent areas are not affected by the spread of energy, and a developed pattern is smaller or narrower.

Therefore, while taking the proximity exposure effect into account, designed pattern data must be corrected to obtain exposure data. The present applicant proposed a method for the preparation of such exposure data in Japanese Patent Application No. Hei 8-13354 (Japanese Unexamined Patent Publication No. Hei 8-321462), filed on Jan. 29, 1996.

According to the method proposed in this Japanese Patent Application, first, a quantity of exposure is set in accordance with the shape of a pattern, while taking the proximity exposure effect into account, and a plurality of mask areas are generated in a sub-field. The pattern densities in these areas are corrected, in accordance with the effects imposed by the pattern densities in the surrounding areas, to acquire substantial pattern densities while taking into consideration the proximity exposure effect. In accordance with the substantial pattern densities, the quantity of exposure (the strength of the exposure beam) of the pattern in each area is reduced, and in addition, for that area an auxiliary exposure patterns are produced.

According to the above method, however, the size of an area to be produced must be small, since pattern sizes are being reduced as a consequence of the recent highly integrated circuit trend. The number of areas is thus increased, and an extended period of time is required for the processing to prepare exposure data.

In addition, if the areas are uniformly created without consideration being given to the shapes and the locations of the patterns, a problem arises in that the corrected exposure data differ, depending on the individual areas for which they are generated, even if all the patterns are the same. In order to eliminate such dependency on the areas, one idea that has been proposed calls for the performance of a process for rearranging areas in accordance with the shapes and the locations of patterns. However, since in this case an additional associated data process must be performed, this idea is not advantageous.

Furthermore, as the number of areas is increased, there is a concomitant extension of the period of time required for data processing, in which the substantial pattern density is acquired from the pattern density of the area to review the quantity of exposure and to generate an auxiliary exposure pattern. As a result, the overall data processing throughput is reduced.

In addition, the generation of auxiliary exposure patterns is uniformly performed for a variety of exposure patterns in accordance with the pattern density of an area and the substantial pattern density resulting from an effect produced by the surrounding areas. However, in a special case, the quantity of exposure for an auxiliary exposure pattern may not be enough, and as a result, a narrow pattern may become much narrower.

In addition, according to the conventional method, even for an isolated pattern which does not require an auxiliary exposure pattern, an auxiliary pattern is generated if the pattern density in an area is low, with the result that there is an increase in the amount of exposure data prepared.

A beam energy expansion characteristic in a resist is not the same for all the resists. So unless auxiliary exposure patterns are formed while taking into account the beam energy expansion characteristic for individual resists, resist patterns having accurate pattern widths can not be formed. And when a plurality of auxiliary exposure patterns having different quantity of exposure are generated, this is accompanied by an increase in the amount of data and a reduction in data processing throughput.

Further, since the quantity of exposure established for a block mask is the same for all the patterns in the block mask, the quantity of exposure is normally set in accordance with the pattern having the minimum line width. This method, however, does not ensure that the optimal quantity of exposure will be set in all cases.

SUMMARY OF THE INVENTION

It is, therefore, one objective of the present invention to provide a charged particle beam exposure method for simplifying data processing required for preparing exposure data from design data and for improving the throughput of a charged particle beam exposure process, and a charged particle beam exposure apparatus therefor.

It is another objective of the present invention to provide a charged particle beam exposure method for reducing the number of areas to be formed during the data processing for the preparation of exposure data using design data and for simplifying the entire data processing, and a charged particle beam exposure apparatus therefor.

It is an additional objective of the present invention to provide a charged particle beam exposure method for eliminating the formation of unnecessary auxiliary exposure patterns and for simplifying the entire data processing, and a charged particle beam exposure apparatus therefor.

It is a further objective of the present invention to provide a charged particle beam exposure apparatus for setting a more appropriate quantity of exposure for an auxiliary exposure pattern and for forming a more accurate resist pattern, and a charged particle beam exposure apparatus therefor.

It is still another objective of the present invention to provide a charged particle beam exposure method for reducing the number of auxiliary exposure patterns in order to perform data processing more efficiently, and a charged particle beam exposure apparatus therefor.

It is a still additional objective of the present invention to provide a charged particle beam exposure method for setting an optimal quantity of exposure for a block mask, and a charged particle beam exposure apparatus therefor.

To achieve the above objectives, according to the present invention, a charged particle beam exposure method, wherein exposure data having exposure pattern data for each of a plurality of sub-fields located in a main field are acquired from pattern data having a pattern data for each of the sub-fields and a sample is exposed in accordance with the exposure data, comprises the steps of:

(a) generating a plurality of areas having different shapes, in accordance with patterns in the sub-fields, and acquiring pattern densities in the areas;

(b) correcting the pattern densities in accordance with pattern densities for areas surrounding the areas and with distances between the areas;

(c) generating auxiliary exposure patterns in the areas when the pattern densities for the areas are lower than a predetermined reference exposure density; and (d) exposing the sample in accordance with the exposure data obtained by adding the data for the auxiliary exposure patterns to the pattern data.

According to the present invention, a variable area can be formed, the number of areas can be reduced, and data processing can be performed more efficiently.

In this invention, since a plurality of computers performs distributed processing for the processes (b) and (c), the overall data processing throughput can be enhanced, even though the number of areas is increased.

Furthermore, in this invention, as a result of the correction, the quantity of exposure for a pattern belonging to the area is reduced, and the quantity of exposure for the auxiliary exposure pattern for that area is increased. As a result, the narrowing of a pattern due to an insufficient exposure quantity can be avoided.

In addition, in this invention, since an auxiliary exposure pattern is substituted by a block mask having a predetermined distribution for through hole pattern density, the number of data items required for an auxiliary exposure pattern can be reduced, and an appropriate quantity of exposure distribution can be provided for the auxiliary exposure pattern.

Further, in the present invention, the quantity of exposure for a block mask is determined in accordance with the shape of a virtual pattern, which has a line width being the same as a minimum line width in the block mask pattern, and the average length of the pattern having the minimum line width. Therefore, a more appropriate quantity of exposure can be set.

BRIEF DESCRIPTION OF THE DRAWINGS

FIG. 10 is a correction table used for an quantity of exposure correction process and an auxiliary exposure pattern generation process;

FIG. 13 is a flowchart for area generation processing according to the embodiment;

FIGS. 14A, 14B and 14C are diagrams for explaining the generation of a variable area based on pattern density;

FIG. 15 is a diagram showing example area data;

FIG. 25 is a minimum line width selection table for a block mask;

FIGS. 26A and 26B are diagrams showing example block masks;

DETAILED DESCRIPTION OF THE PREFERRED EMBODIMENT

The preferred embodiment of the present invention will now be described while referring to the accompanying drawings. Note, however, that the technical scope of the present invention is not limited to this embodiment. The present invention is applied for a charged particle beam exposure method and an apparatus therefor, and in the description given for this embodiment, an electron beam exposure method and an apparatus therefor are employed as an example.

Figure 1:
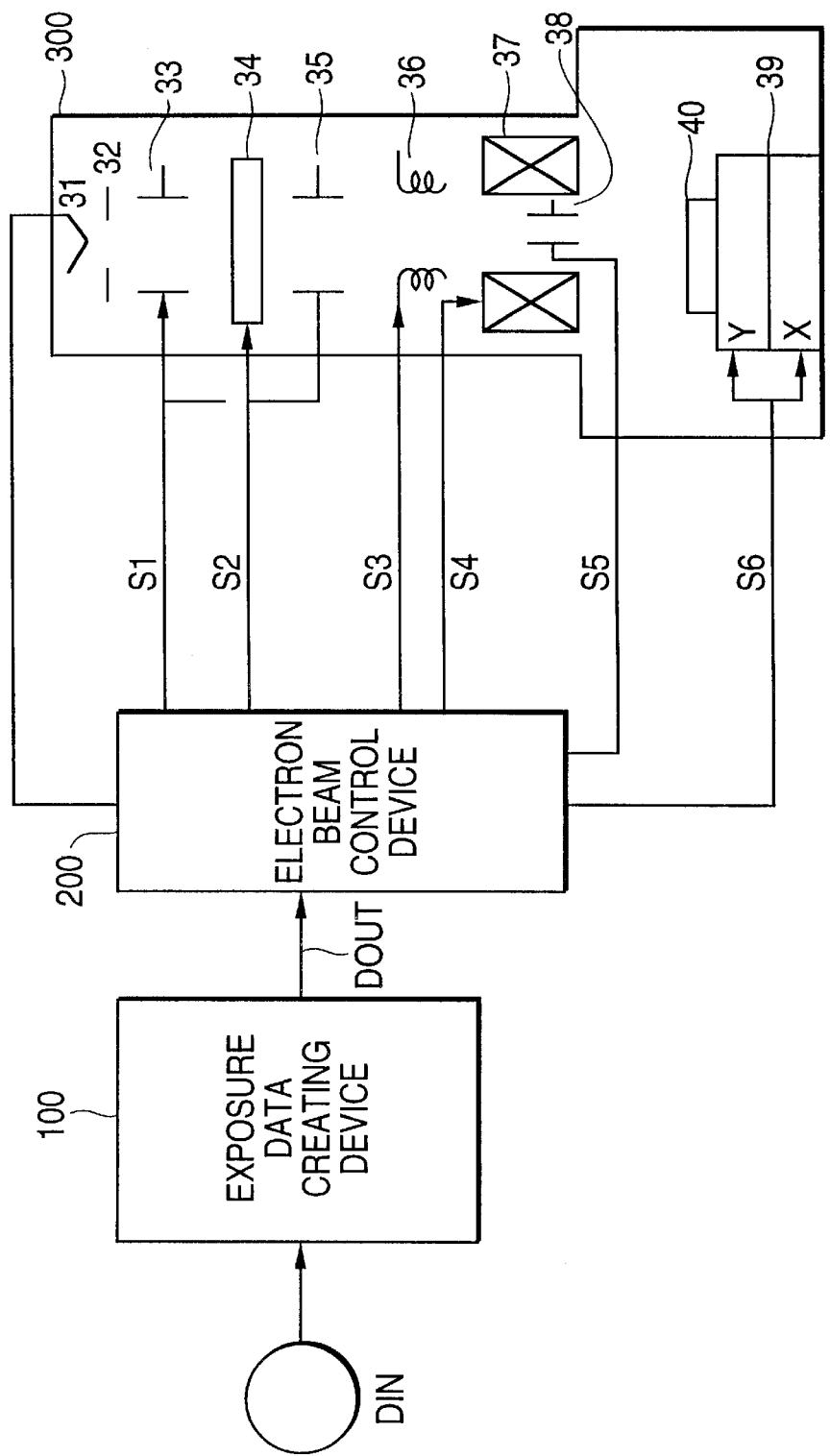
FIG. 1 is a schematic diagram illustrating the arrangement of a charged particle beam exposure apparatus according to one embodiment of the present invention.

FIG. 1 is a schematic diagram illustrating the arrangement of an electron beam exposure apparatus according to the embodiment of the present invention. In this embodiment, the electron beam exposure apparatus comprises: an exposure data creating device 100, for receiving design data Din, including pattern data, and for outputting exposure data Dout, created while taking into account the proximity exposure effect; an electron beam control device 200, for receiving the exposure data Dout for controlling the exposure apparatus; and a mirror barrel 300. In the mirror barrel 300 are provided an electron gun 31; a rectangular transmission mask 32; an exposure transmission mask 34, such as a block mask; mask deflectors 33 and 35; a focal lens 36; an electromagnetic deflector 37; an electrostatic deflector 38; and an X and Y stage 39 on which a wafer 40 is mounted. A rectangular beam shaped by the transmission mask 32 passes through a predetermined transmission mask selected by the mask deflectors 33 and 35, and is projected onto a desired position on the wafer by the deflectors 37 and 38.

The electron beam controller 200 generates a control signal S1 for the mask deflectors 33 and 35, a control signal S2 for moving the transmission mask 34 horizontally, a control signal S3 for the focal lens 36, a control signal S4 for the electromagnetic deflector 37, a control signal S5 for the electrostatic deflector 38, and a control signal S6 for the stage 40.

Figure 2:
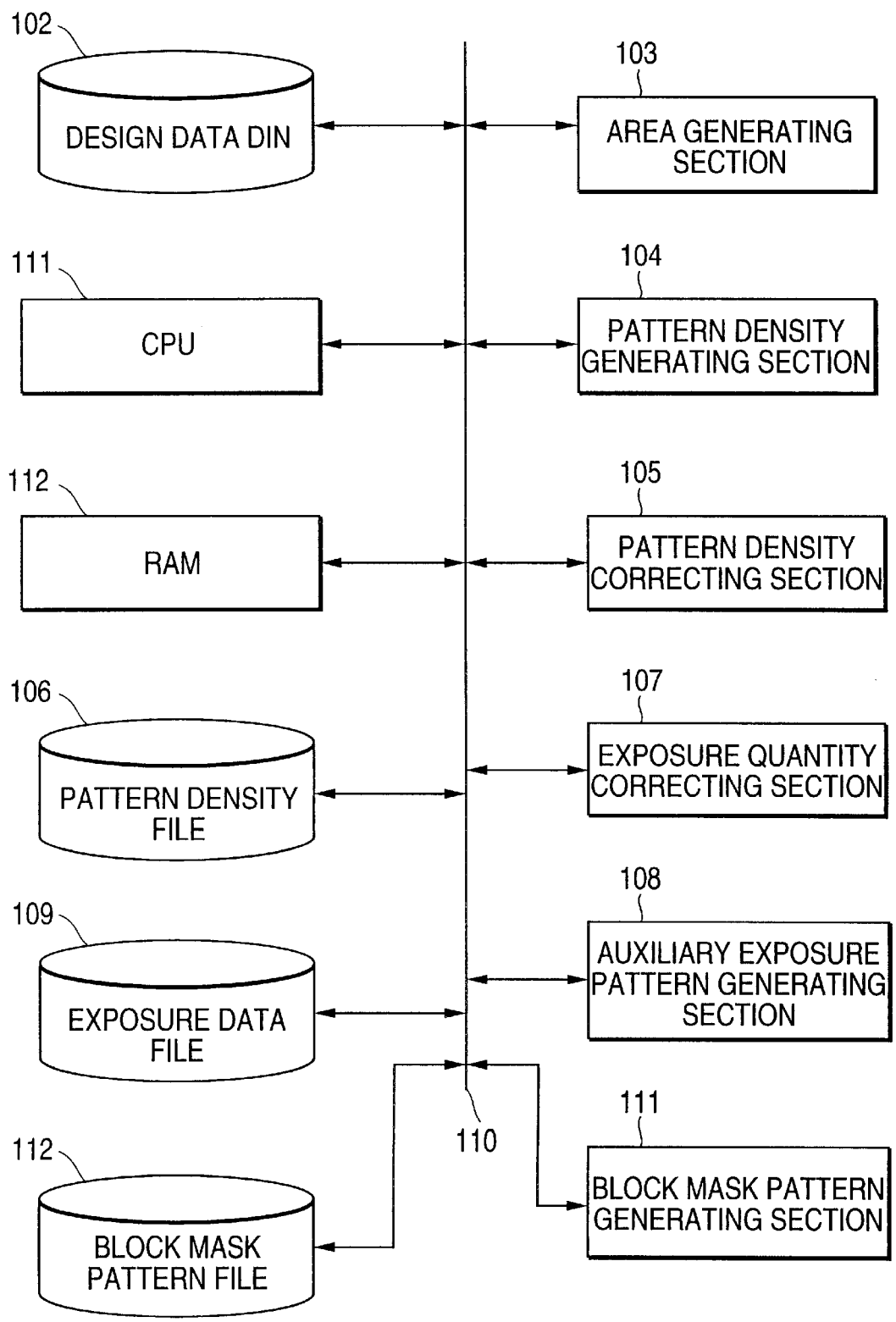
FIG. 2 is a diagram illustrating the internal arrangement of an exposure data generation device.

FIG. 2 is a diagram illustrating the internal arrangement of the exposure data preparation unit 100. The exposure data creating device 100 comprises: a design data file 102, in which design data Din are stored; an area generating section 103, for forming an area in a sub-field; a pattern density generating section 104, for calculating a pattern density in an area; a pattern density correcting section 105, for correcting a pattern density in an area while taking into account the influence of adjacent areas; a pattern density file 106, in which pattern density data for an area are stored; an exposure quantity correcting section 107, for correcting the quantity of exposure for a pattern in an area in accordance with the pattern density; an auxiliary exposure pattern generating section 108, for generating an auxiliary exposure pattern in an area in accordance with the pattern density; an exposure data file 109, in which exposure data are stored; a block mask pattern generating section 111; and a block mask pattern file 112. These components are connected to a CPU 111 via a bus 110.

The exposure data creating device 100 may be constituted by a single workstation, or by a plurality of work stations whereby a large amount of data is processed.

Exposure Data Creating Method

Figure 3:
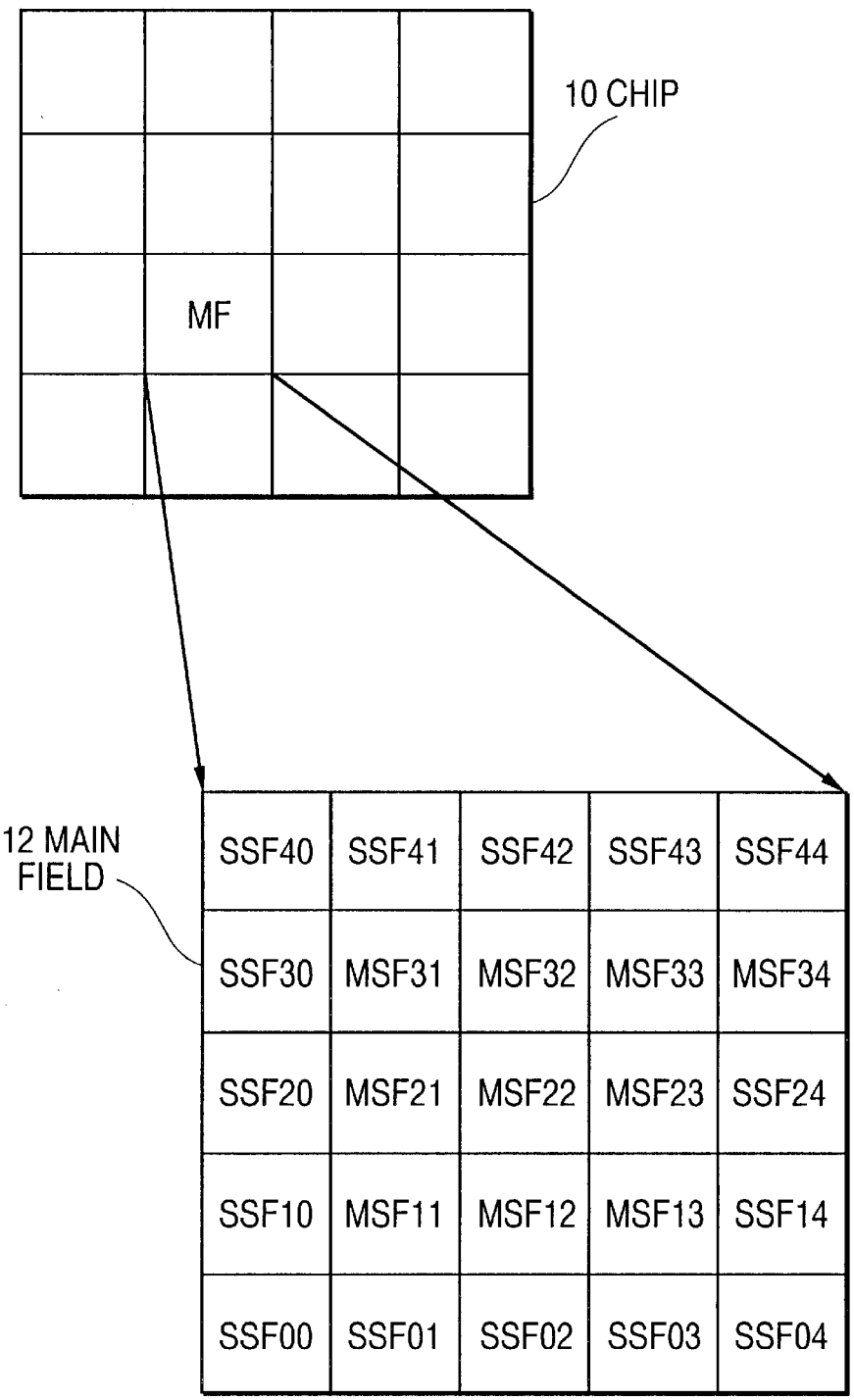
FIG. 3 is a diagram showing the relationship between a main field MF and sub-fields SF.

The method employed for creating exposure data using design data will now be explained. FIG. 3 is a diagram showing the relationship between a main field MF and sub-fields SF on a semiconductor chip 10. Normally, a plurality of semiconductor chips 10 are formed on a semiconductor wafer. As is shown by the exposure apparatus in FIG. 1, the electron beam deflectors comprise the electromagnetic deflector 37, the deflection range of which is large even though its response speed is low, and the electrostatic deflector 38, the response speed of which is high even though its deflection range is small. The main field MF is an area wherein the beam can be deflected by the electromagnetic deflector 37, and the sub-field SF is an area wherein the beam can be deflected by the electrostatic deflector 38.

The wafer 40 is moved to the center of a desired main field MF by driving the X and Y stage 39, the electron beam is deflected in the main field MF by the electromagnetic deflector 37, the electron beam formed into a desired shape, is deflected by the electrostatic deflector 38, and finally, the deflected beam is projected onto a desired location. In the example in FIG. 3, one main field 12 is divided into five rows and five columns of sub-fields, SF00 to SF44.

In FIG. 3, in the main field 12 are provided independently positioned sub-fields SSF, all of which have different patterns, and matrix-positioned sub-fields MSF, all of which have the same pattern and are repeatedly arranged. The repeated matrix-positioned sub-fields MSF are those that are frequently seen in, for example, the memory cell areas of memory devices. On the other hand, the independently positioned sub-fields are those that are frequently seen in peripheral circuits and logic circuits. As is described above, the chip 10 is divided into a plurality of main fields, which are further divided into a plurality of sub-fields. The design data Din includes pattern data existing in the individual sub-fields.

The sub-fields are not always arranged as shown in FIG. 3, with no overlapping and no intervening intervals, and may be partially overlapped or arranged at intervals.

Figure 4:
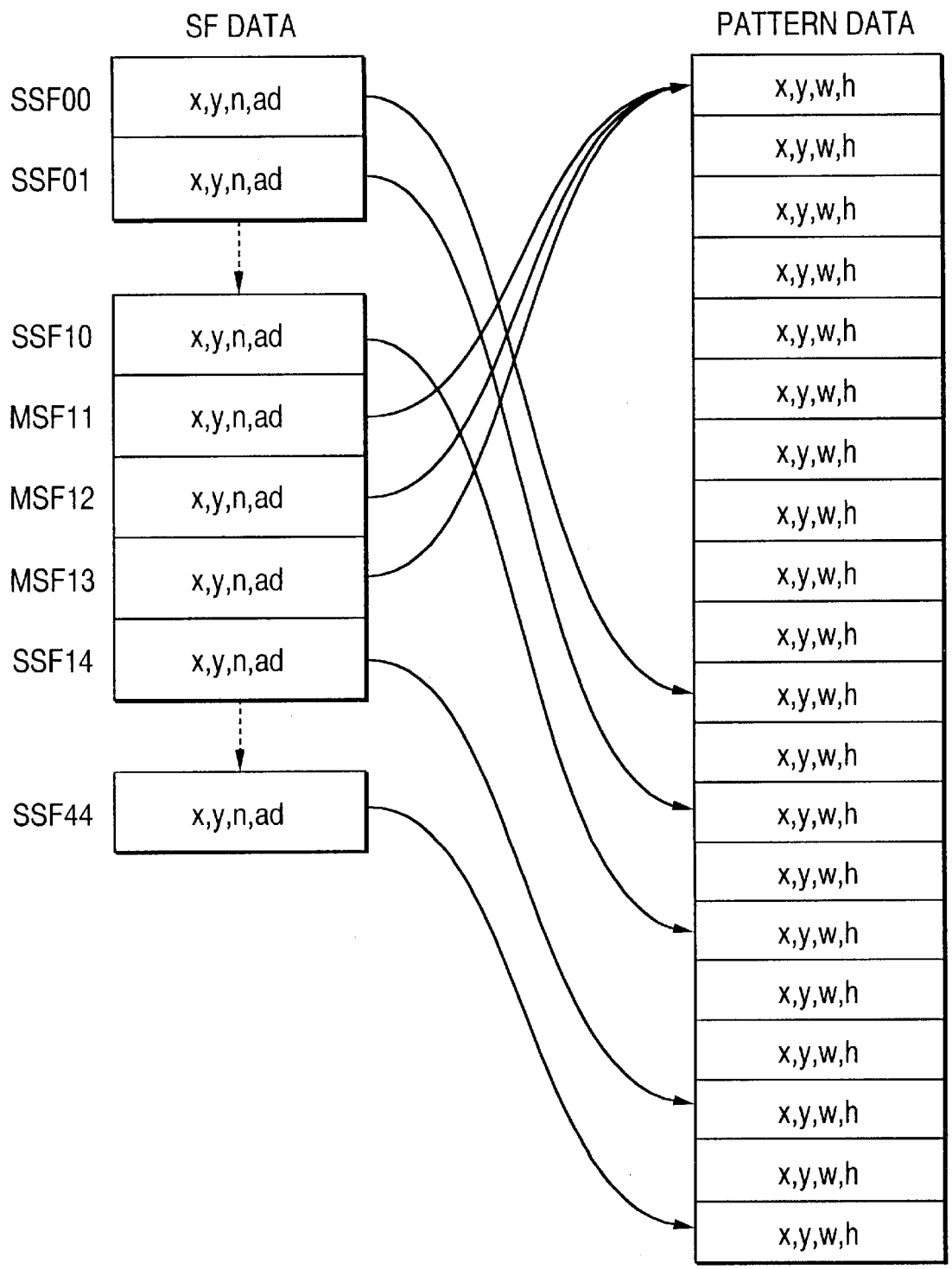
FIG. 4 is a diagram showing an example structure for design data for the sub-fields in the main field in FIG. 3.

FIG. 4 is a diagram showing an example structure for the design data for the sub-fields in the main field 12 in FIG. 3. In this example, the data in the sub-fields SF00 to SF44 include the center coordinates (x, y) of the corresponding sub-fields, pattern number n and pattern address ad. The sub-field data are arranged in the order of the sub-fields in the main field 12, i.e., SSF00, SSF01, . . . , MSF11, MSF12, . . . and SSF44.

The pattern data includes the coordinates (x, y) at the lower left of the pattern, and the width w and height h of the pattern. The address ad in the sub-field data represents an address in the pattern data, and the pattern in n address areas equivalent to the pattern count n sequentially read from the address ad represents the pattern data in each sub-field.

Therefore, the data in the independently positioned sub-fields SSF includes addresses for the different pattern data. The data in the matrix-positioned sub-fields MSF include the address for the same pattern data. The data structure for the matrix-positioned sub-field is called a hierarchial data structure in this specification. With the hierarchial data structure, the amount of pattern data can be reduced.

Figure 5:
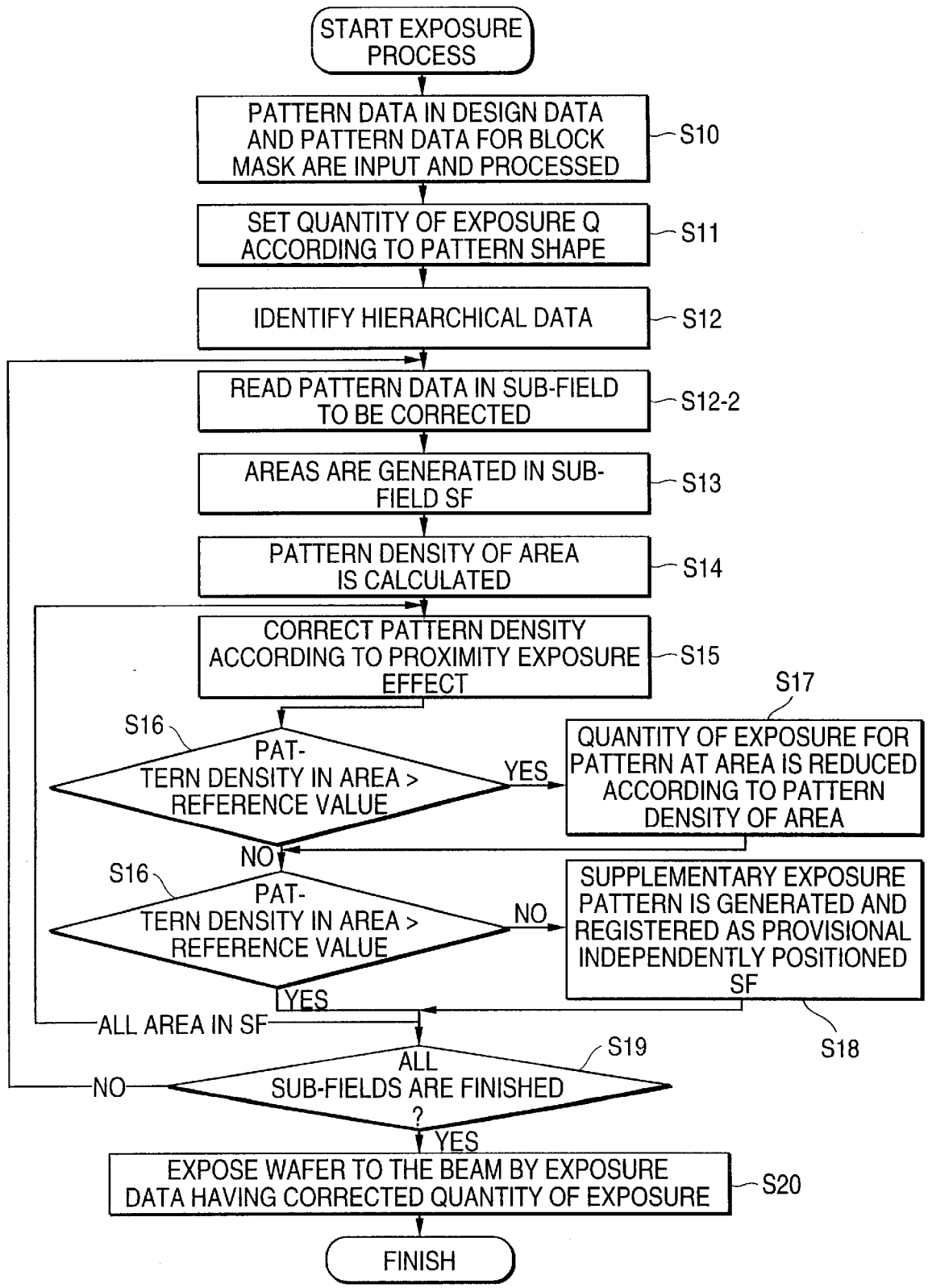
FIG. 5 is a flowchart showing exposure processing, including generation of exposure data.
Figure 6:
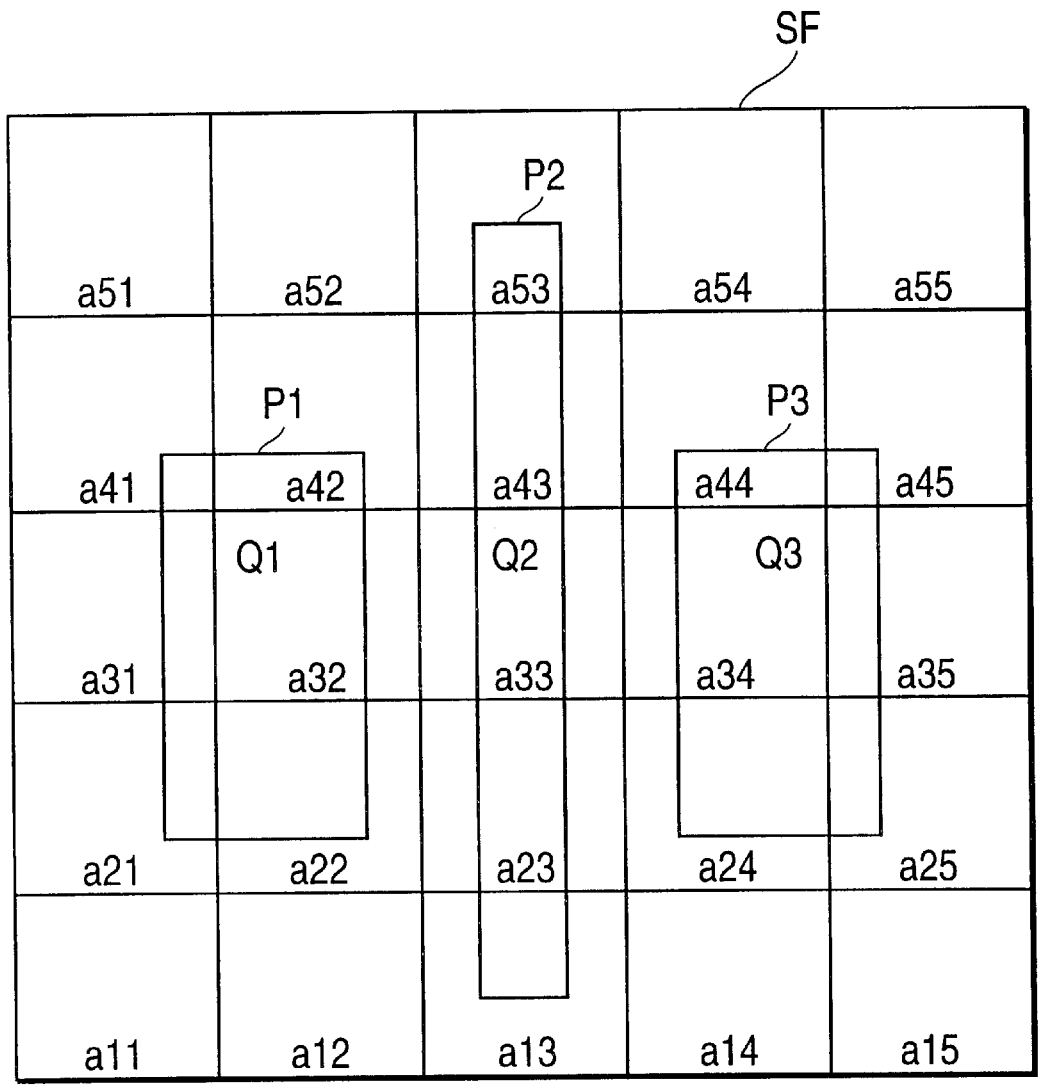
FIG. 6 is a diagram showing a specific sub-field SF.

FIG. 5 is a flowchart showing the exposure processing including the generation of exposure data. FIG. 6 is a diagram showing a specific sub-field SF. The method for preparing exposure data will now be described while employing the sub-field in FIG. 6.

In FIG. 5, first, the pattern data included in the design data and pattern data for a block mask are input (S10). This process will be described later. At step S11, the quantity of exposure Q is determined in accordance with the shape of each pattern. A high quantity of exposure Q is set when the pattern shape is narrow, and a low quantity of exposure Q is set when the pattern shape is wide or large. The determined quantity of exposure Q (not shown) is added to the pattern data. The setting of the quantity of exposure Q in accordance with the pattern shape will be described later.

Following this, hierarchial data are identified by using design data, which includes all the sub-fields on the chip and their pattern data (S12). That is, whether the attribute for the sub-field is either for the independently positioned sub-field SSF, for the matrix-positioned sub-field MSF, or for the first matrix-positioned sub-field of all the matrix-positioned sub-fields is determined from the design data. Therefore, the attribute data ad (not shown) is added to the sub-field data.

The design data includes only a pattern to be formed on the resist layer of the wafer. However, when the resist layer of the wafer is irradiated by the electron beam, more beam energy is applied to an area having a higher pattern density due to the proximity exposure effect, while an area having a lower pattern density is not affected by the proximity exposure effect and less beam energy is applied thereto. Thus, taking the proximity exposure effect into account, the quantity of exposure for the pattern included in the design data should be reviewed, and auxiliary exposure should be performed as needed to compensate for the inadequate quantity of exposure and to improve the accuracy of the pattern shape which has been developed. In this embodiment, in order to prepare exposure data based on the design data, a small map area is formed in the sub-field, and the pattern density in the area is employed to review the quantity of exposure and to generate an auxiliary exposure pattern.

For this purpose, the pattern data in the sub-field to be corrected are read (S12-2). In the pattern data reading process, pattern data in the sub-field which is adjacent to the sub-field to be processed are also read because the proximity exposure effect which the peripheral area of the target sub-field can be taken into consideration.

The sub-field SF shown in FIG. 6 includes patterns P1, P2 and P3. At step S11, the quantities of exposure Q1, Q2 and Q3 are set for the patterns P1, P2 and P3 in accordance with their pattern shapes. Further, five rows and five columns of areas a11 to a55 are generated in the sub-field SF (S13). This area is generated by the area generating section 103 in FIG. 2. Using the area generation method, an area having a predetermined size is arranged in a matrix shape while using, for example, the lower left position of the sub-field SF as a reference. Therefore, the end of the sub-field does not always match the end of the area. The areas for adjacent sub-fields are not shown in FIG. 6 and the following drawings.

In the example in FIG. 6, the pattern P1 is located in areas a21, a22, a31, a32, a41 and a42; the pattern P2 is located in areas a13, a23, a33, a43 and a53; and the pattern P3 is located in areas a24, a25, a34, a35, a44 and a45.

Figure 7:
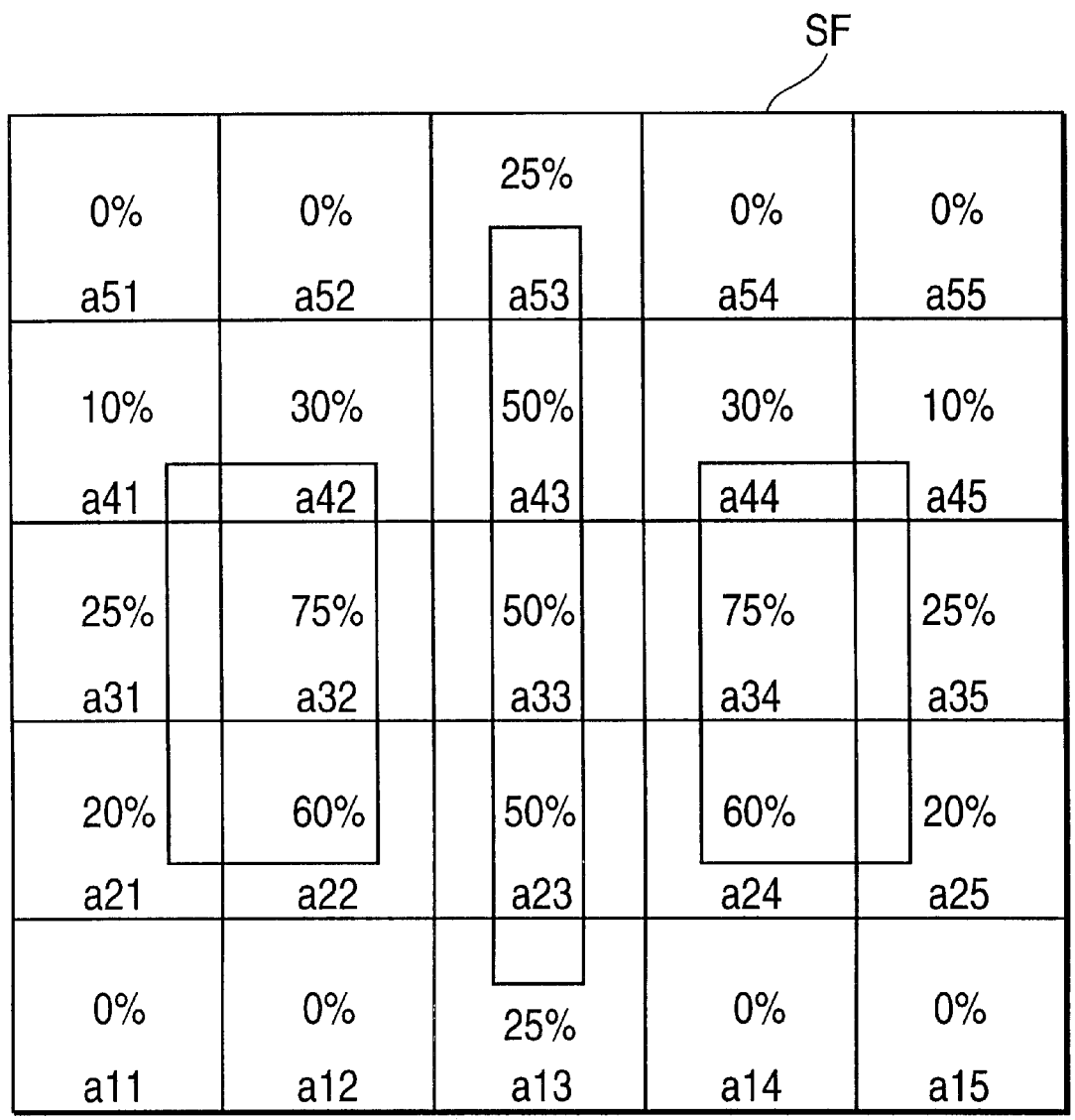
FIG. 7 is a diagram showing an example where pattern density Smn is entered for each area of the sub-field in FIG. 6.

At step S14, the pattern densities of the individual areas are calculated by the pattern density generating section 104 in FIG. 2. In FIG. 7 is shown an example wherein pattern density Smn is entered in each area in the sub-field in FIG. 6. The ratio of the pattern density to the area a32 or a34 is high, i.e., 75%, and the pattern density of the area a11 where no pattern exists is 0%.

At step S15, the pattern density in each area is corrected in accordance with the proximity exposure effect between areas. The correction of the pattern density is performed by the pattern density correcting section 105 in FIG. 2. The energy of an electron beam projected onto the patterns of the areas surrounding a specific area has an influence on the specific area which is proportionate to the distance between the areas. The influence exerted by an area which is near is great, and the influence exerted by an area which is at a distance is small. In this embodiment, therefore, a coefficient $\beta(r)$ (r is a distance between the areas), which substantially is inversely proportional to the distance, is set in advance, and is multiplied by the pattern density Smn for the surrounding area, the result being added to the pattern density of the target area.

Figure 8:
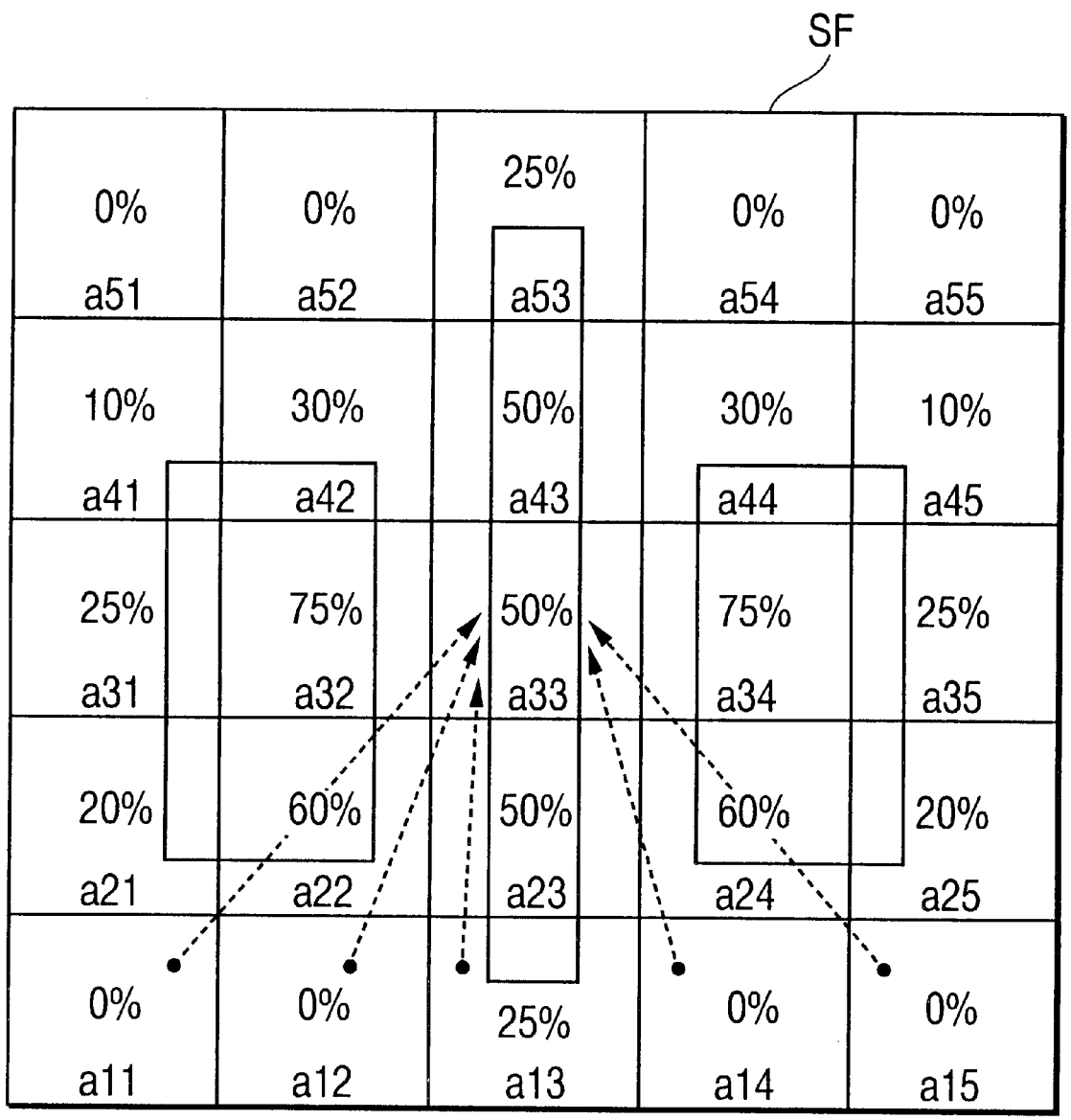
FIG. 8 is a diagram for explaining the correction of the pattern densities due to the proximity exposure effect between adjacent areas.

FIG. 8 is a diagram for explaining a correction of the pattern density performed in accordance with the proximity exposure effect. In this example, the pattern density in area a33 is corrected. The proximity exposure effect originating in areas a11 to a55 surrounding area a33 is added to the pattern density of area a33. Since, for example, the pattern density of area a11 is 0% (=$S_{11}$), the strength of the effect is $S_{11} \times \beta(r(a_{11}-a_{33}))=0$, where $r(a_{11}-a_{33})$ is the distance between the centers of areas a11 and a33. The proximity exposure effect originating at area a12 is also 0. Since the pattern density of areas a13 is 25% (=$S_{13}$), the strength of the effect is $S_{31} \times \beta(r(a_{13}-a_{33}))$. The same process is performed for areas a14 to a55. As a result, the pattern density of area a33 is corrected from 50% to, for example, 60%.

There are areas which are adjacent to area a33 and which have high pattern densities. Thus, the energy of the electron beam projected onto those surrounding areas has a great effect on area a33. Taking the proximity exposure effect into account, the substantial pattern density $SR_{33}$ of area a33 is a value obtained by adding the pattern density $S_{33}$ to the density $\Delta S_{33}$ which is produced by the effect originating in the surrounding areas.

Figure 9:
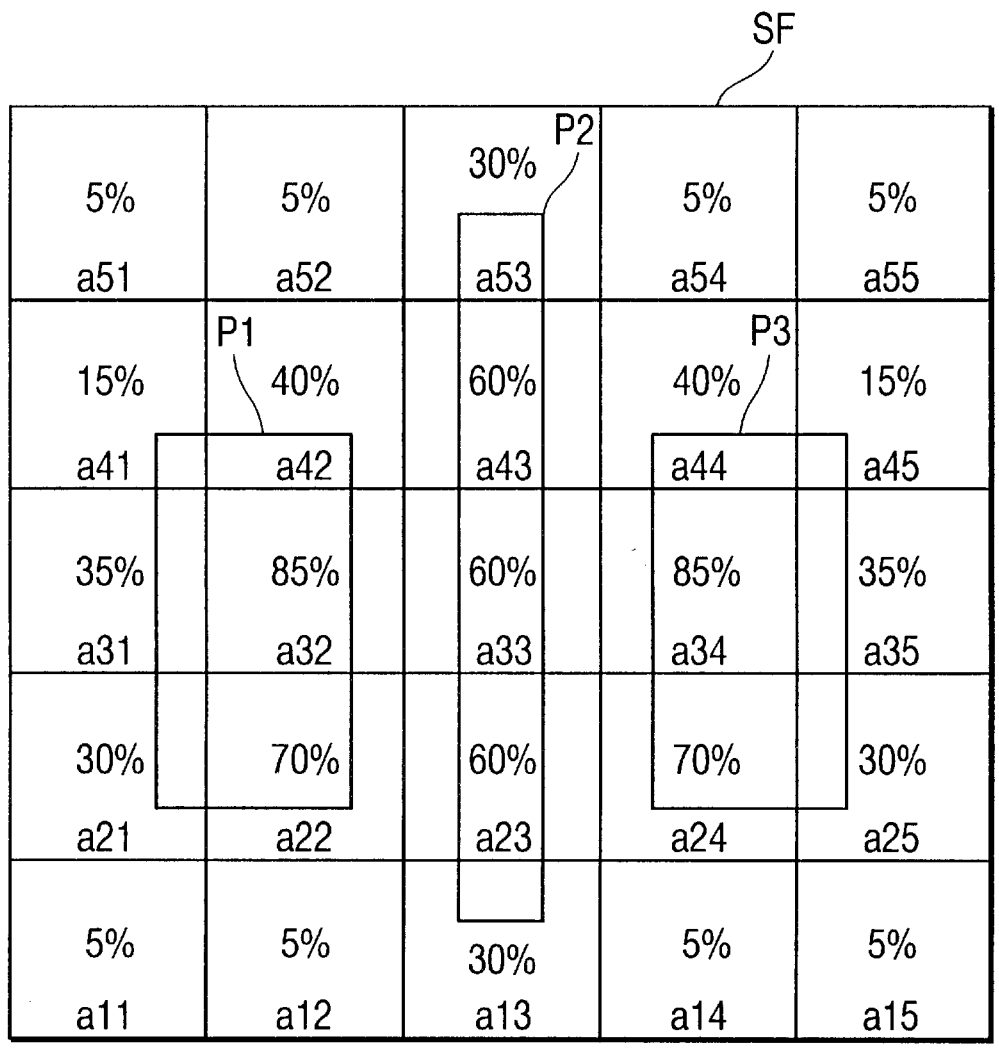
FIG. 9 is a diagram showing the pattern densities for individual areas as determined by the pattern density correction performed for the areas.

FIG. 9 is a diagram showing the pattern densities in the individual areas after they have been corrected. The pattern density of an area which is adjacent to areas having high pattern densities is increased, for example, by 10%, while the pattern density of an area which is not adjacent to areas having high pattern densities is increased, for example, by 5%. As for areas such as area a11 which are located at the edges of the sub-field SF, the strength of the effect originating at an area in an adjacent sub-field is added to the pattern density.

When the pattern densities SRmn of the areas have been corrected as is shown in FIG. 9, they are employed to correct the quantities of exposure for the patterns P1, P2 and P3 (S17), and to generate an auxiliary exposure pattern (S18). These processes are performed in accordance with whether the pattern density in each area is greater or less than a reference value.

At step S11, the quantities of exposure Q for the patterns P1, P2 and P3 were set in accordance with their shapes, while at step S17, the quantity of exposure is corrected while taking into account the strength of the proximity exposure effect originating at the surrounding patterns. To do this, the substantial pattern density obtained for each area at step S15 is employed. Specifically, when the substantial pattern density SRmn is equal to or greater than the reference value, that area is greatly affected by the proximity exposure effect, and the pattern quantity of exposure for the area is reduced.

When the substantial pattern density SRmn is smaller than the reference value, that area is little affected by the proximity exposure effect, therefor an auxiliary exposure pattern is generated for this area and is added to the exposure data. The auxiliary exposure pattern is an exposure pattern for providing an energy strength corresponding to the proximity exposure effect in regions of low pattern density, and uniformly has a low quantity of exposure of, for example, several percent or so of the exposure energy. The preferable size of the auxiliary exposure pattern is the same as the area size. The location of the auxiliary exposure pattern need not be the same as that of the area which is formed to correct the pattern density.

FIG. 10 is a correction table used for the quantity of exposure correction process (S17) and the auxiliary exposure pattern generation process (S18). In this example, the pattern densities SRmn of the areas are divided to eleven levels, and a quantity of exposure correction ratio $\alpha$ and an auxiliary exposure pattern are shown for each level. The reference value is set to 45.5%, and when the pattern density of an area is greater than the reference value, the quantity of exposure Q of the pattern in the area is multiplied by the ratio α in FIG. 10. That is, the quantity of exposure Q of the pattern for an area whose pattern density SRmn exceeds 90.5% is multiplied by the ratio α=0.1. Similarly, when the pattern density SRmn of an area is 81.5% to 90.5%, the preset quantity of exposure Q is multiplied by the ratio α=0.2.

On the other hand, when the pattern density of an area is smaller than the reference value, it means that the density in the vicinity of the area is low, and a pattern which has been exposed and developed becomes narrow. Therefore, to perform an auxiliary exposure of the area, an auxiliary exposure pattern is produced as exposure data. In FIG. 10, auxiliary exposure patterns to perform auxiliary exposures 1 to 5 are produced for levels 1 to 5 having low pattern densities. The auxiliary exposure 1 provides an auxiliary exposure pattern having a large quantity of exposure, and the auxiliary exposure 5 provides an auxiliary exposure pattern having a low quantity of exposure. These auxiliary exposure patterns are as large as the areas.

Figure 11:
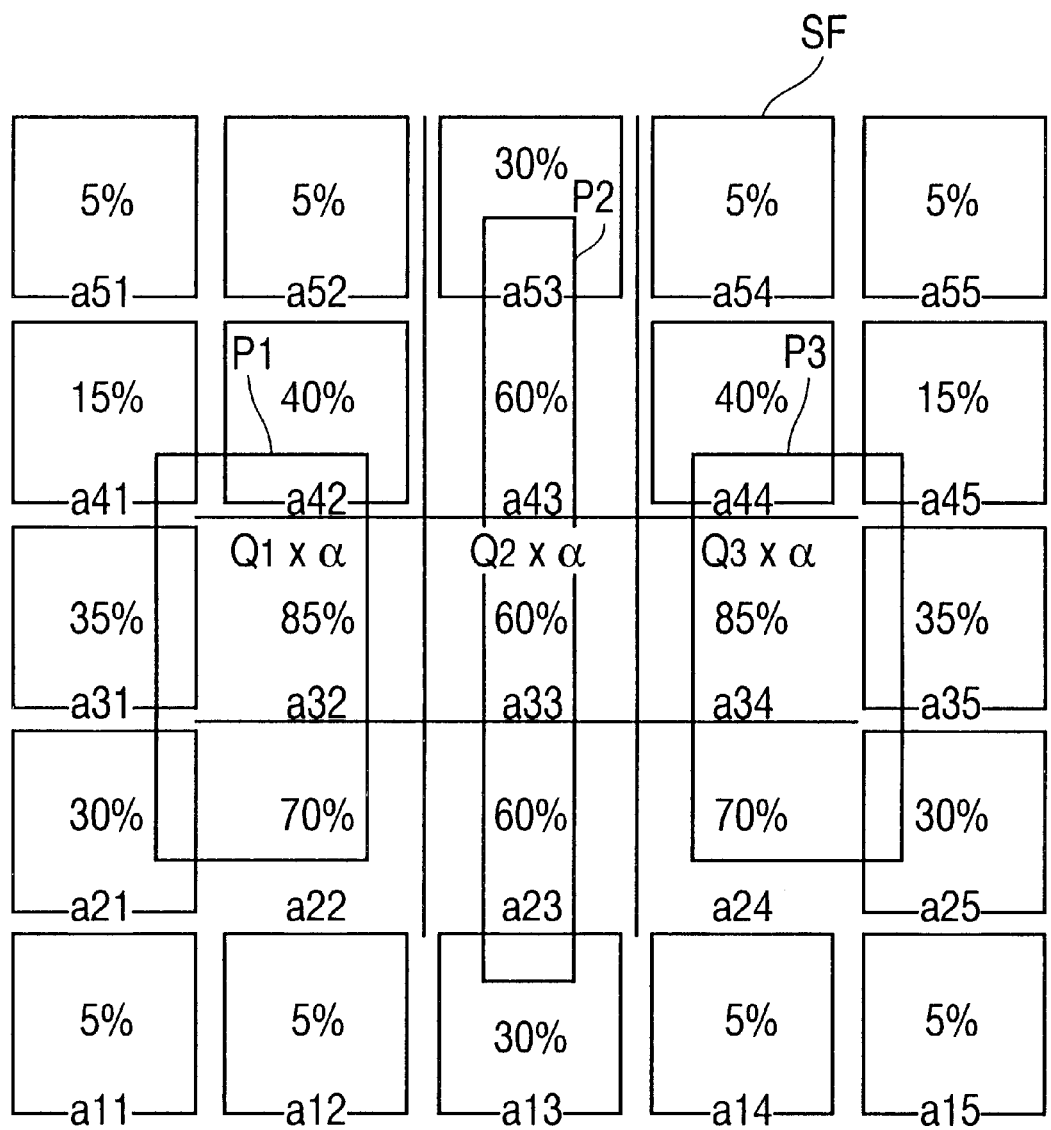
FIG. 11 is a diagram showing a sub-field when the pattern quantity of exposure for an area having a high pattern density is reduced, and an auxiliary exposure pattern is generated in an area having a low pattern density.

In FIG. 11 is shown a sub-field when the quantity of exposure for a pattern in an area having a high pattern density is reduced and an auxiliary exposure pattern is generated for an area having a low pattern density. In this example, the quantities of exposure Q for the patterns P1, P2 and P3 for the areas a22, a32, a23, a33, a43, a24 and a34, which have high pattern densities, are multiplied by the ratio α, so that the quantities of exposure Q are reduced. The auxiliary exposure patterns (indicated by thick lines) are produced for the areas all to a21, a25, a31, a35, a41, a42, a44, a45 and a51 to a55, which have low pattern densities.

In FIG. 11 is shown a sub-field SF. Therefore, the electrostatic deflector of the exposure apparatus can employ an electron beam to irradiate the sub-field area to form an arbitrary pattern within it. Thus, the patterns P1, P2 and P3 are exposed to the corrected exposure intensities, and the auxiliary exposure patterns that have been newly produced are also exposed with the quantities of exposure which are individually designated.

In FIG. 11, the area formed to acquire the pattern density is used as an auxiliary exposure pattern area. However, the auxiliary exposure pattern area may differ from the area formed to calculate the pattern density.

As is shown in FIG. 5, areas are formed for each sub-field and their pattern densities are calculated and are then corrected in accordance with the proximity exposure effect. Based on the pattern densities, the quantity of exposure Q of the pattern is corrected and an auxiliary exposure pattern is generated. As a result, the exposure data are generated.

Figure 12:
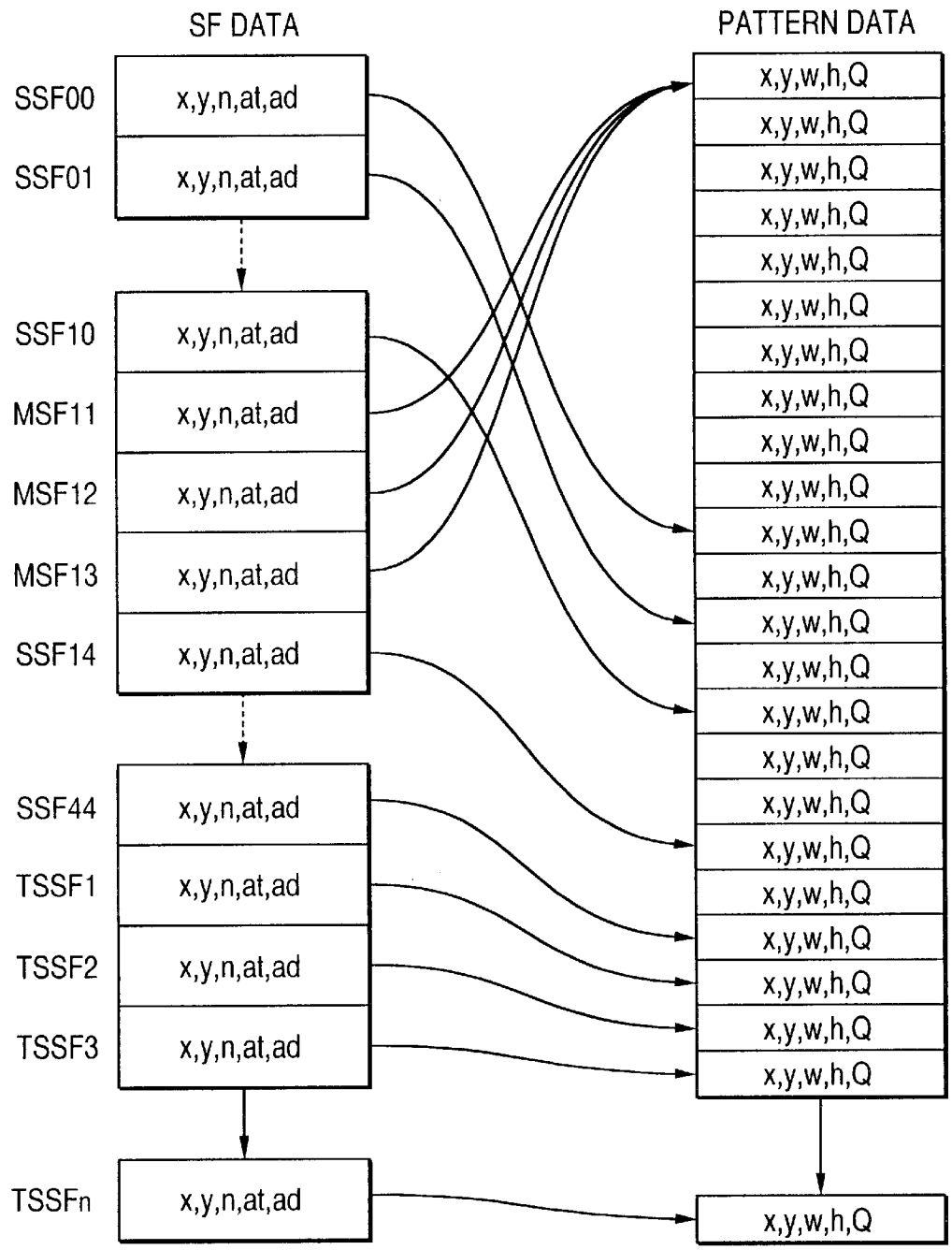
FIG. 12 is a diagram showing an example structure for exposure data.

FIG. 12 is a diagram showing an example structure for the thus created exposure data. The differences between the design data and the exposure data are as follows. First, the pattern data of the design data in FIG. 4 include position data (x, y), the width w and the height h, while the pattern data of the exposure data further include the quantity of exposure Q. The quantity of exposure Q is set in accordance with the pattern shape (S11), and is then corrected by using the pattern density of the area. Second, the design data in FIG. 4 does not include, as sub-field data, attribute data for an independently positioned sub-field, a matrix-positioned sub-field and the reference sub-field for the matrix-positioned sub-field, while the sub-field data in the exposure data additionally include attribute data "at" during the processing performed to identify the hierarchial data (S12). Third, the design data consists of the sub-fields SSF00 to SSF44 and pattern data for the sub-fields, while the exposure data further includes auxiliary exposure sub-fields TSSF1 to TSSFn which have auxiliary exposure patterns.

To maintain the hierarchial structure of the sub-field data and the pattern data, the auxiliary exposure patterns are recorded in the exposure data in the form of exposure patterns in the provisional independently positioned sub-fields TSSF1 to TSSFn, which are a type of newly added independently positioned sub-field. In FIG. 12, the provisional independently positioned sub-fields TSSF1 to TSSFn are added after an independently positioned sub-field SSF44. The provisional independently positioned sub-fields have auxiliary exposure patterns equivalent in size to that of the area. Since the auxiliary exposure pattern in each provisional independently positioned sub-field is not repeated, the characteristic of that sub-field is the same as that of an independently positioned sub-field. Therefore, the exposure data for an independently positioned sub-field and those for a provisional independently positioned sub-field are treated in the same manner. It should be noted that a plurality of auxiliary exposure patterns are produced in a provisional independently positioned sub-field.

The sub-fields need not be provided across the entire main field, as is shown in FIG. 3, and may partially overlap, depending on the exposure pattern. In the exposure process, an exposure pattern included in each sub-field is simply irradiated by an electron beam at the position of the sub-field. Therefore, the sub-field for the auxiliary exposure pattern can be registered, while overlapping the sub-field for the exposure pattern. Thus, the auxiliary exposure pattern can be added to the exposure data without destroying the hierarchial data structure.

As previously described, the quantity of exposure for a pattern in the provisional independently positioned sub-field, which is added to the sub-field for the design data, is not high enough to expose the resist layer.

The thus generated exposure data Dout are transmitted to the electron beam controller 200, which then performs an electron beam exposure in accordance with the exposure data (S20).

The features of the above exposure data preparation method are: 1) areas are generated in a sub-field in order to generate exposure data while taking into account the proximity exposure effect which is dependent on exposure density and distance; 2) the quantity of exposure is corrected and an auxiliary exposure data is generated for a particular area on the basis of effective or substantial pattern density SRmn, which is derived by adding the proximity exposure effect originating at the surrounding areas to a pattern density Smn of an area; and 3) the auxiliary exposure data are used as pattern data for a provisional independently positioned sub-field which is newly generated, instead of being pattern data in an existing sub-field.

A pattern width becomes thinner as the integration is improved. Therefore, an area which is to be used for the correction of the quantity of exposure and the generation of an auxiliary exposure pattern must be small. Thus, the number of areas to be generated is increased, and an extended period of time is required for the data processing for the generation of exposure data.

In the embodiment of the present invention, upon the trade-off requirements for a microscopic pattern and for a reduction of the area count, the formation of the above uniform areas, the formation of a variable area based on the pattern density, or the formation of a variable area using the pattern scanning method while taking the vertex position of a pattern into account can be selected in accordance with the design data to be processed. That is, at the beginning of the exposure process, option data indicating a selection of area formation method are input by an operator. It should be noted that both of generation the production of variable area based on the pattern density, and the generation of variable area using the pattern scanning method are performed by a new generation algorithm.

FIG. 13 is a flowchart for the area generation processing in this embodiment, which corresponds to steps S13 and S14 of the exposure processing in FIG. 5. In FIG. 13, steps S31 and S32 are processes for the generation of uniform areas; steps S31 to S35 are processes for the generation of a variable area based on the pattern density; and steps S40 to S43 are processes for the generation of a variable area using the pattern scanning method.

As is described above, a check is performed in accordance with an instruction from an operator to determine which area generation is selected. When the area generation using the pattern scanning method is selected, a variable area is generated at steps S40 to S43 (S30). When the variable area generation based on the pattern density is selected, a variable area is generated at steps S31 and S32, and at steps S34 and S35 (S33). The algorithms for the generation of these areas will now be explained while referring to the flowchart.

FIGS. 14A to 14C are diagrams for explaining the process steps S31 to S35 for the generation of a variable area based on the pattern density. When the area generation using the pattern scanning method is not selected, equally divided areas are generated in the sub-field SF, as is shown in FIG. 14A (S31). In FIG. 14A, equally divided areas are generated relative to a region 400 including the sub-field SF and the area surrounding it. The pattern density Smn in each area is calculated in the same manner as was explained while referring to FIG. 7 (S32). In the example in FIG. 14A, the pattern densities Smn of the individual areas $a_{mn}$ are 25%, 30%, 40% and 50%.

When the generation of uniform areas is selected, the area generation and the calculation of the pattern densities for the areas are terminated for the condition shown in FIG. 14A. When the generation of a variable area based on the pattern density is selected, steps S34 and S35 are initiated.

In the process for forming a variable area based on the pattern density, adjacent areas having the same or nearly the same pattern density are replaced by a larger area, since throughout the quantity of exposure correction processing sequence explained in FIG. 5, including correction of the pattern densities (S15), the correction of the quantity of exposure (S17) and the production of the auxiliary exposure pattern (S18), the same results are obtained for the areas having the same pattern densities. When the areas are coupled together to form a large area, for each area the number of data processing steps can be reduced during the quantity of exposure correction processing at steps S15 to S18.

In the process for generating a variable area based on the pattern density, first, as is shown in FIG. 14B, an area which is adjacent in the X direction (horizontal direction) and has the same pattern density is replaced by a larger area (S34). Areas described by thick lines are those which have been newly produced. As is shown in FIG. 14C, an area which is adjacent in the Y direction (vertical direction) and has the same pattern density is also replaced by a larger area (S35). In this case, the quadrilateral structure of a newly formed variable area is maintained to prevent the following data processing operation from becoming complicated. In the example in FIG. 14, 8×8=64 areas are reduced to 15 areas.

FIG. 15 is a diagram showing example area data prepared due to the generation of areas. For the sub-field $SF_{mn}$, the coordinates (x1, y1), (x1, y2) . . . for the lower left location of each area $a_{mn}$ are stored as data for a generated areas a11, a12. . . . The area data includes, as attribute data, position (X1, Y1), the position of existing pattern in the area, the pattern density, the pattern density after correction, and a flag indicating whether an auxiliary exposure pattern has been produced. The quantity of exposure reduction rate will be descried later.

Figure 16:
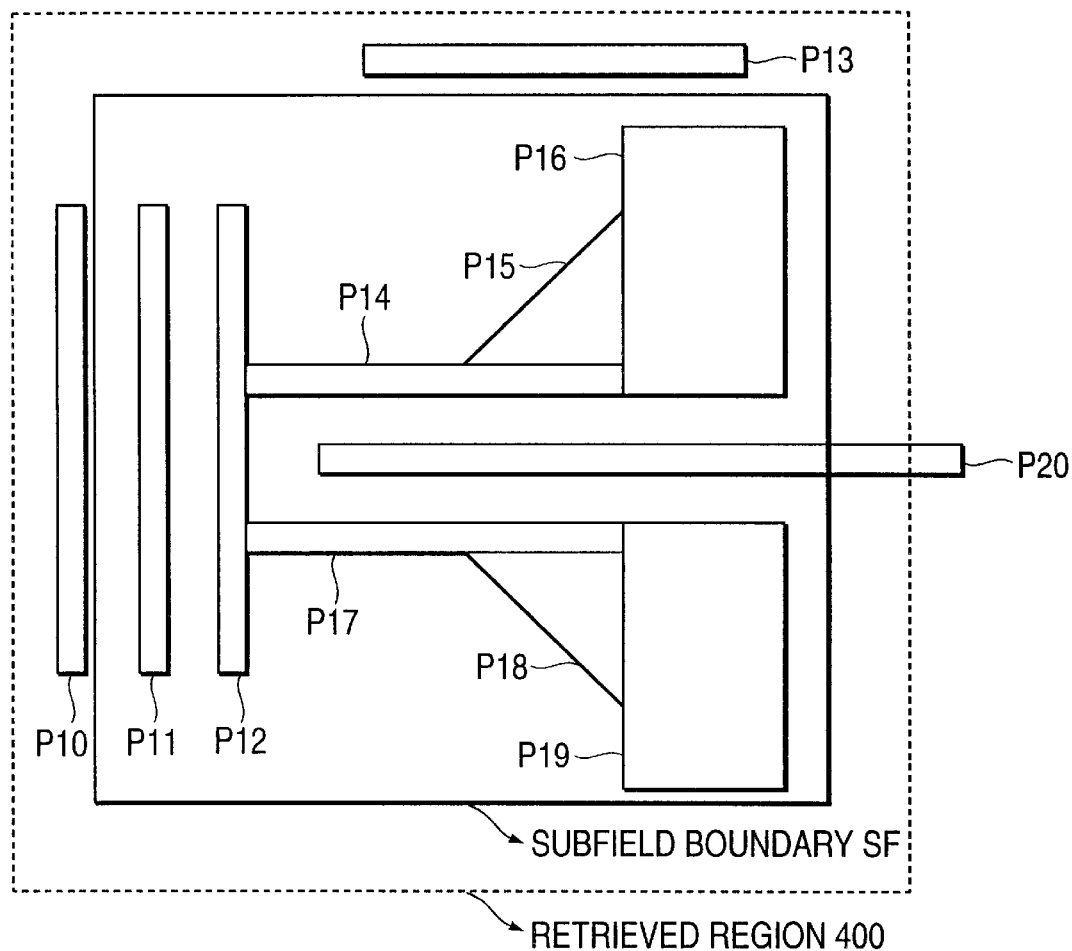
FIG. 16 is a diagram for explaining variable area generation using a pattern scanning method.
Figure 17:
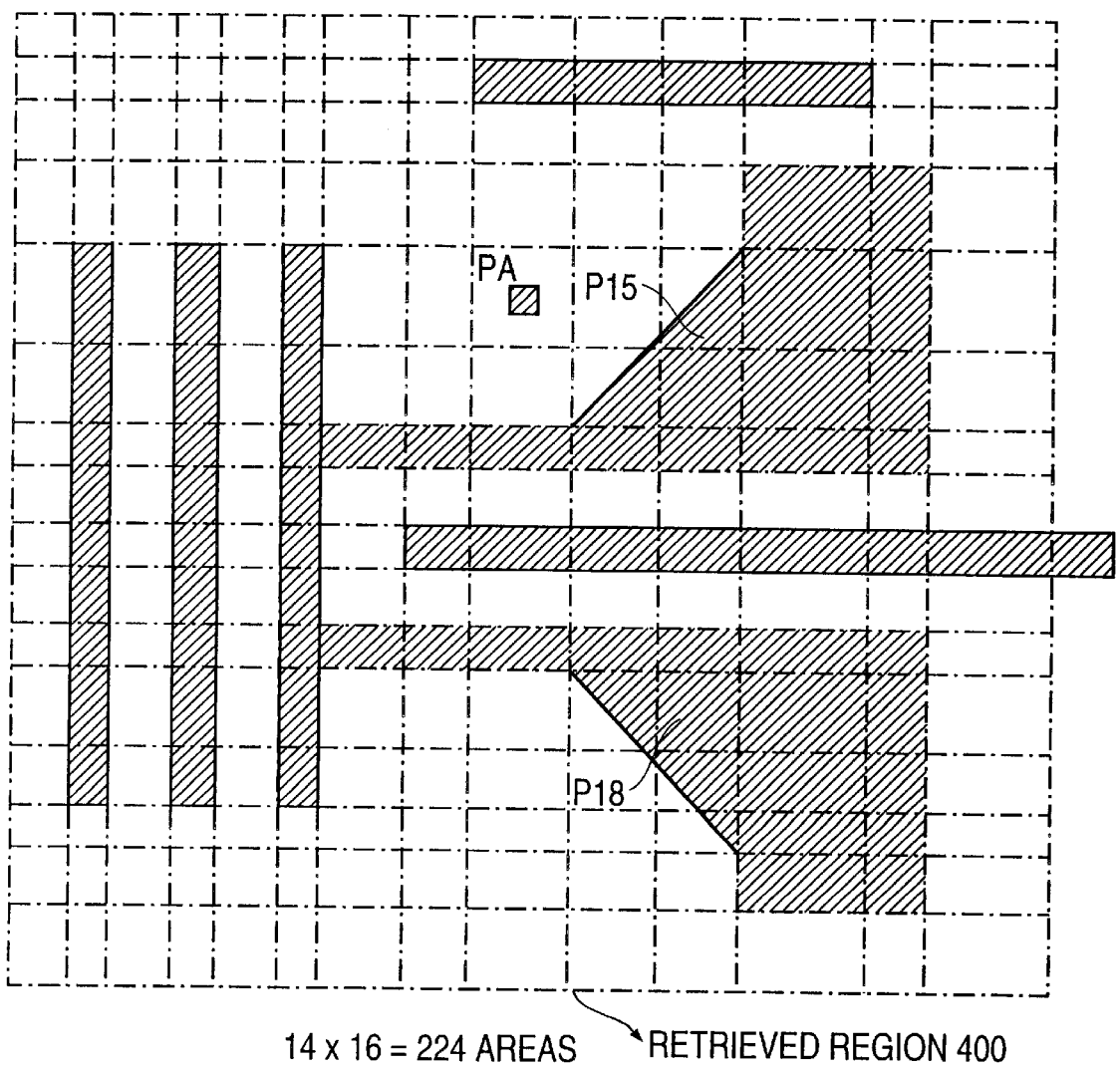
FIG. 17 is a diagram for explaining variable area generation using the pattern scanning method.
Figure 18:
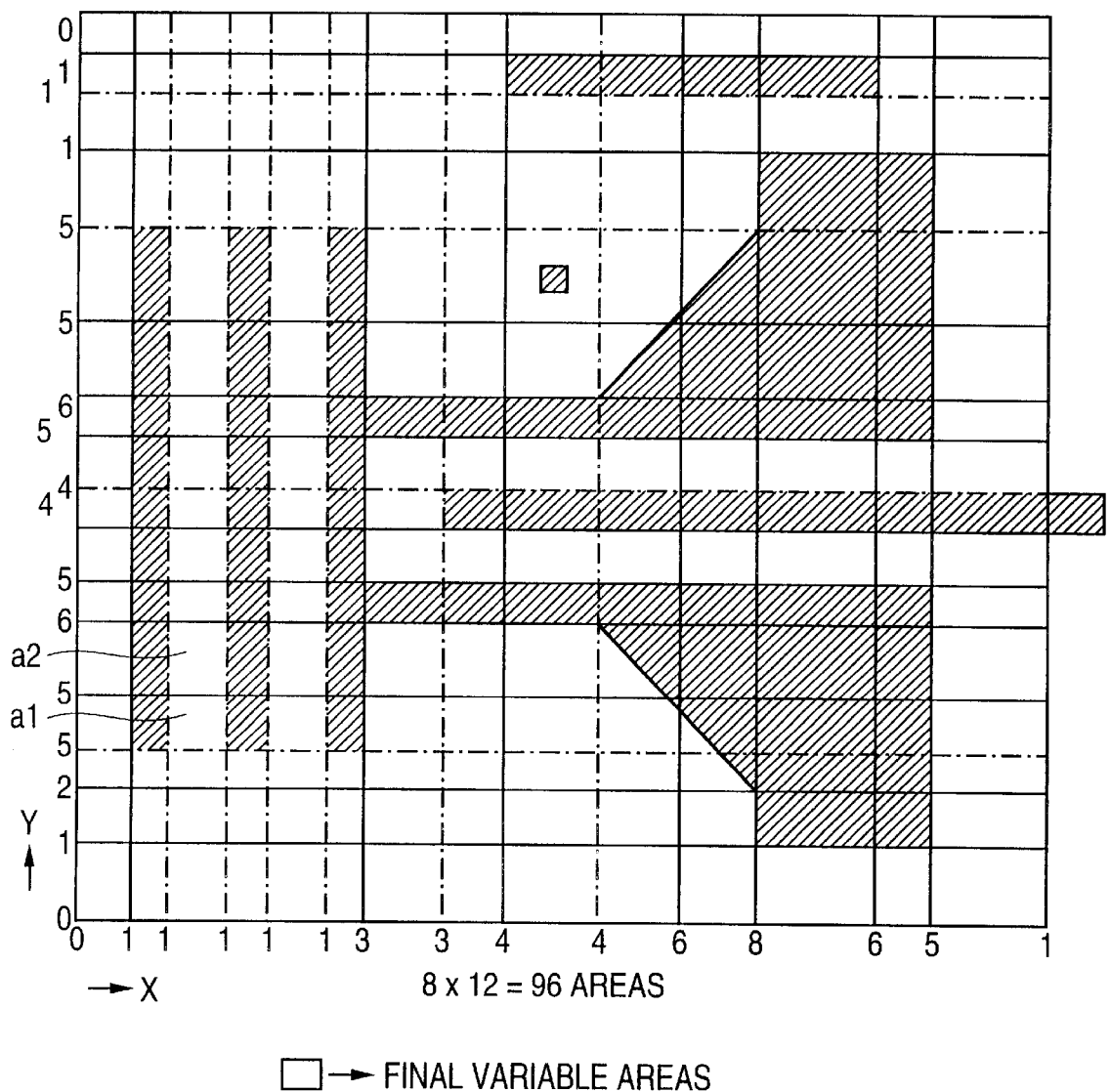
FIG. 18 is a diagram for explaining variable area generation using the pattern scanning method.

FIGS. 16, 17 and 18 are diagrams for explaining the generation of a variable area using the pattern scanning method. In FIG. 16 are shown patterns P10 to P20 in a retrieved region 400 which includes a sub-field SF and the area surrounding it. The generation of a variable area using the pattern scanning method in this embodiment will now be described while employing this example.

The pattern data in the design data include the coordinates (x, y), the width w and the height h, as was explained while referring to FIG. 4. The coordinates at the vertexes of each pattern are acquired from the pattern data, and, as is shown in FIG. 17, line segments (described by chained lines) in the X direction and in the Y direction are produced which pass through the vertexes of the patterns (S40). The horizonal and the vertical line segments include perimeter of the retrieved region 400. The triangular patterns P15 and P18 are regarded as sets of tiny squares to generate line segments. In this example, the triangles P15 and P18 have formed four areas. A minute pattern PA in FIG. 17 is excluded from the target patterns for the line segment generation in order to prevent an increase in the number of line segments.

Since the horizontal and the vertical line segments shown in FIG. 17 pass through the vertexes, the number of mapped areas is 14×16=224. The areas completely match the locations and the shapes of the patterns P10–P20. It should be noted that the pattern densities of the areas, excluding the triangles and the minute pattern PA, are either 100% or 0%. These densities, therefore, do not conform to the algorithm in FIG. 5 for correcting the quantity of exposure based on the pattern density.

Then, as is shown in FIG. 18, the patterns P10 to P20 belonging to each line segment are counted (S41). The number of patterns belonging to each line segment are listed along two sides in FIG. 18. The number of patterns in FIG. 18 is easily obtained by referring to the first patterns in FIG. 16.

Adjacent line segments which have the same pattern count in the X and Y directions (indicated by arrows) are combined together to form a new larger area $a_{mn}$ (S42). For example, an area $a_1$ is formed by combining the vertical line segments whose pattern counts in the X direction are one and by combining the horizonal line segments whose pattern counts in the Y direction are five. An area $a_2$ is formed by combining the vertical line segments whose pattern counts are matched only in the X direction, i.e., one. As a result, as is indicated by the thick lines in FIG. 18, larger variable areas are obtained.

The patterns are made uniform in the X direction or in the Y direction within the large area, which is obtained by coupling areas in which the line segments passing through the vertexes have the same pattern count. That is, the pattern density in the variable areas $a_1$ and $a_2$ are uniform respectively. As is described above, a large variable area can be formed by combining areas having the same pattern densities. This is similar to the previously described variable area generation based on the pattern density. In addition, by using the pattern scanning method, the conventional problem whereof the area locations are not matched with the locations and shapes of the patterns can be resolved.

The pattern density for each area in FIG. 18 is calculated (S43), and as is shown in FIG. 18, areas having rational sizes are formed, with an area where patterns are closely located having a high pattern density, and an area where few patterns are located having a low pattern density. These procedures conform to the following correction process for an individual area (steps S15 to S18 in FIG. 5).

As is described above, according to the embodiment, the generation of variable area can reasonably reduce the number of areas for highly integrated LSI data. In this embodiment, to reduce the data processing procedures, the area correction at steps S15 and S18 in FIG. 5, which can be performed for each area individually, can be processed distributedly by a selection made by an operator. In the meaning of the distributed processing, a plurality of area data sets in a sub-field are transmitted to a plurality of computers, which then perform in parallel the processes at steps S15 to S18. As a result, savings can be realized in the area data communication time and the area correction processing time.

To perform the distributed processing, the unit for the distribution of a plurality of areas in a target sub-field must be determined as needed. The distribution unit is determined in accordance with the capabilities and the number of computers which perform the distributed processing. The peripheral areas surrounding a specific area should be included in the distribution unit, so that the pattern density of the specific area can be corrected in accordance with the proximity exposure effect shown in FIG. 8.

Figure 19:
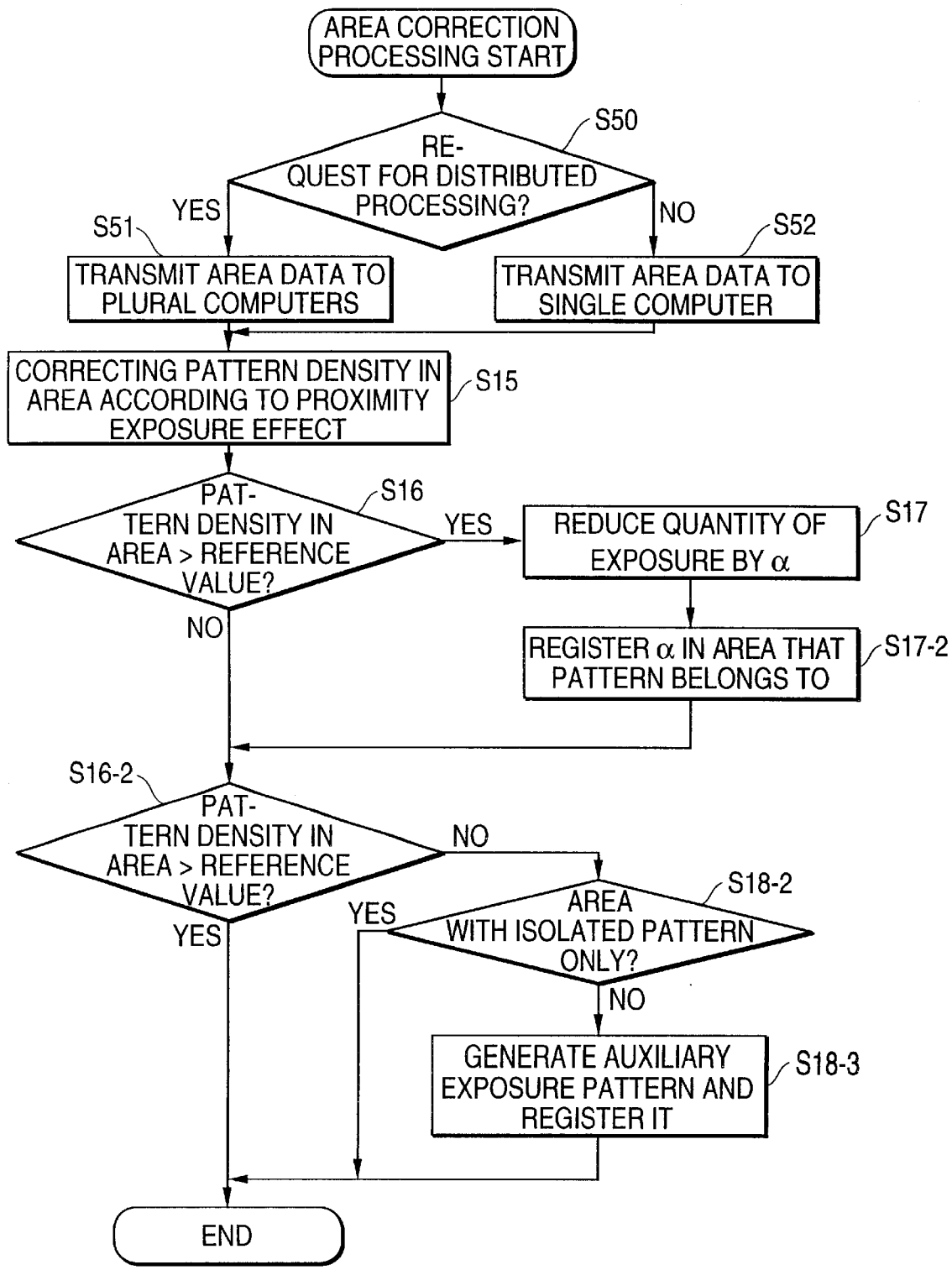
FIG. 19 is a flowchart for internal area correction processing according to the embodiment.

FIG. 19 is a flowchart showing the area correction processing according to this embodiment. In this flowchart, the processing performed at steps S15 to S18 in FIG. 5 is shown in detail. The distributed processing for area correction constitutes an optional process which can be selected by an operator, as in the variable area generation process. Therefore, first, a check is performed to determine whether there is a request for distributed processing (S50). If such a request has been entered, the distribution unit is determined, and area data prepared by the distribution unit are transmitted to a plurality of computers (S51). If no request for distributed processing has been entered, all the area data for a target sub-field are transmitted (S52).

Following this, as explained while referring to FIGS. 8 and 9, the pattern densities in the areas are corrected in accordance with the proximity exposure effect (S15). When the pattern density is high (S16), the quantity of exposure Q for pattern in the area is reduced in accordance with the ratio α by referring to the correction table in FIG. 10 (S17). The reduction rate is recorded in the area data for all the areas to which the pattern belongs (S17-2). That is, as is shown in FIG. 15, the quantity of exposure reduction rate, as well as the original pattern density and the pattern density after correction, is recorded in the area data.

When the pattern density obtained by the review is low (S16-2), an auxiliary exposure pattern is produced. In this embodiment, however, since there is no influence from peripheral area to an area having an isolated pattern, even if its pattern density is low, an auxiliary exposure pattern is not produced (S18-2). In other words, in case where an area having a predetermined or higher pattern density does not exist in a periphery of a specific area, an auxiliary exposure pattern is not generated for that specific area. Therefore, the amount of auxiliary exposure pattern data which is conventionally increased can be reduced. More specifically, in case where a pattern providing a proximity exposure effect does not exist within a predetermined distance X$\mu$m from a specific area, an auxiliary exposure pattern is not generated for that specific area.

Figure 20:
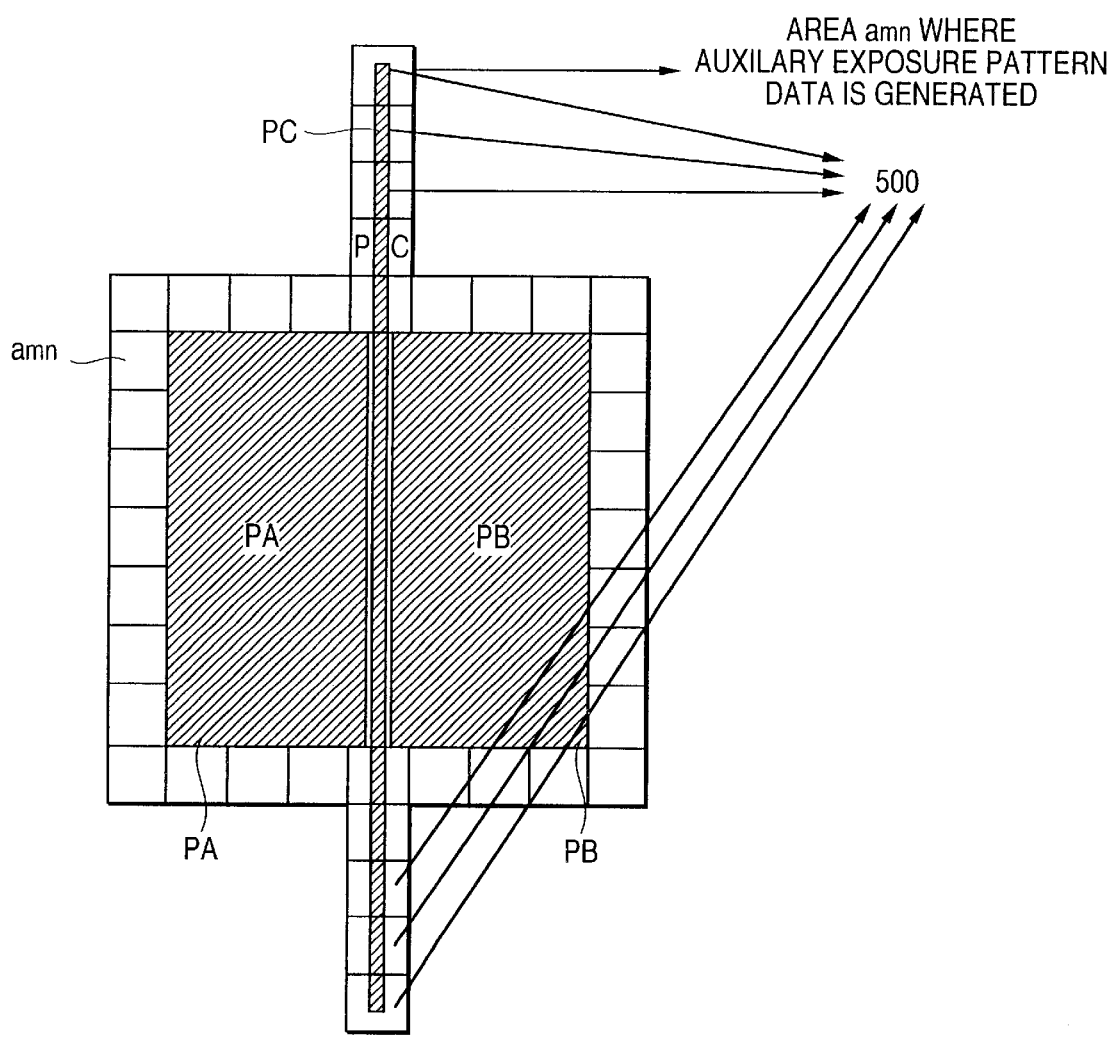
FIG. 20 is a diagram for explaining the formation of an auxiliary exposure pattern at step S18-3 in FIG. 19.

FIG. 20 is a diagram for explaining the generation of an auxiliary exposure pattern at step S18-3 in FIG. 19. In this example are shown comparatively large patterns PA and PB, and a narrow pattern PC which is partially adjacent to them. In this case, since the pattern densities of areas $a_{mn}$ which enclose the patterns PA, PB and Pc are low, production of an auxiliary exposure pattern is required for the areas $a_{mn}$.

However, the pattern density of the area obtained as a result of the correction is quite high in the region between the large patterns PA and PB. As a result, the quantity of exposure Q of the pattern PC is reduced at step S17. Thus, in an area 500 to which belong the portions of the pattern PC which are far away from the patterns PA and PB, the narrowing of the pattern PC due to the proximity exposure effect can not be prevented by the quantity of exposure of the auxiliary exposure pattern, which is uniformly provided and depends only on the pattern density, as is shown in the correction table in FIG. 10. In other words, since the quantity of exposure for the pattern PC is reduced more than is necessary in accordance with the condition in the region between the large patterns PA and PB, the quantity of exposure for the auxiliary exposure pattern, which is obtained by using only the pattern density in the area 500 as a reference, is too low.

In this embodiment, therefore, when the quantity of exposure for the pattern PC is reduced at step S17, as is shown in FIG. 15, the quantity of exposure reduction rate is added to the area data for the areas to which the pattern PC belongs (S17-2). And for each area, an auxiliary exposure pattern is formed which has the quantity of exposure provided while taking into account the pattern density in FIG. 10 and the quantity of exposure reduction rate (S18-3). More specifically, according to the correction table in FIG. 10, the quantity of exposure for the auxiliary exposure pattern is increased as the pattern density of the area is reduced and as the quantity of exposure reduction rate becomes greater. Therefore, when a plurality of areas have the same pattern density, the quantity of exposure for the auxiliary exposure pattern is so set that it is high for an area having a greater quantity of exposure reduction rate. When the quantity of exposure reduction rates for a plurality of areas are the same, the quantity of exposure for the auxiliary exposure pattern is set high for an area having a low pattern density.

As a result, for a portion, such as the area 500, far away from the patterns PA and PB, the quantity of exposure for the auxiliary exposure pattern is higher than the conventional intensity. Therefore, the narrowing of the pattern PC can be resolved.

According to the electron beam exposure method in this embodiment, provided are a new auxiliary exposure pattern with which greater pattern accuracy can be obtained and a new setup for the quantity of exposure for a block mask.

Figure 21A:
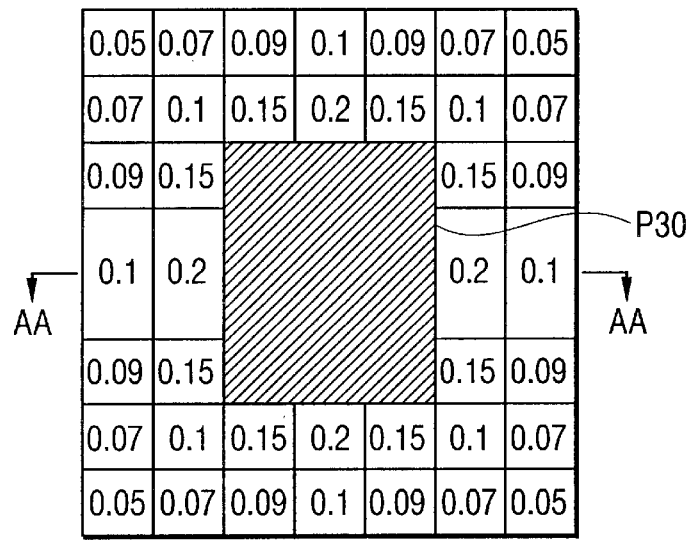
FIGS. 21A and 21B are diagrams showing a specific example of the pattern density after an area correction and the quantity of exposure for the auxiliary exposure pattern.
Figure 21B:
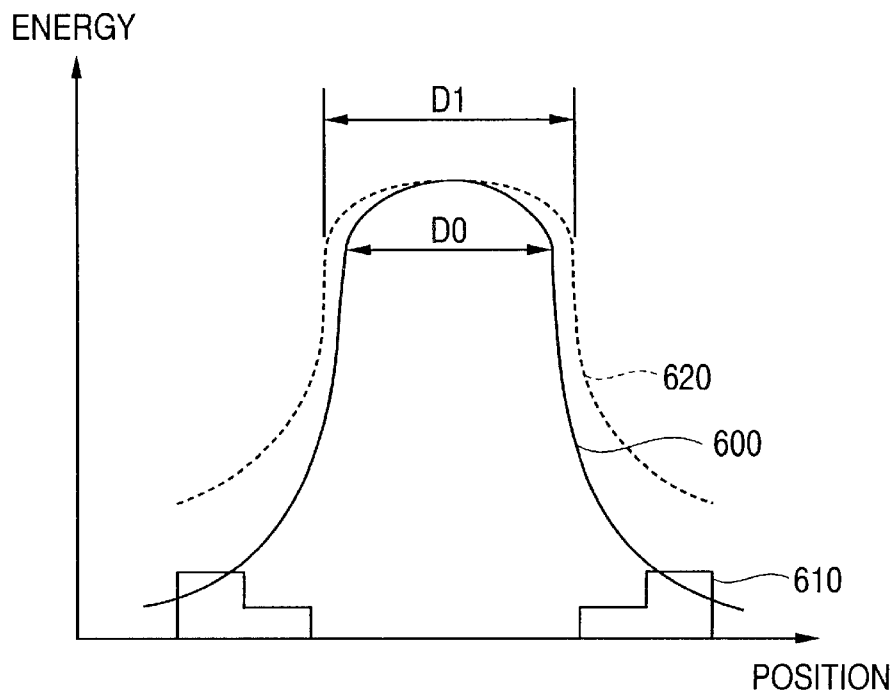

FIGS. 21A and 21B are specific diagrams illustrating the pattern densities of areas after correction review is performed and the quantity of exposure for the auxiliary exposure pattern. In FIG. 21A are shown a pattern P30 and pattern densities of surrounding areas after they have been corrected. The pattern densities of the surrounding areas after they were corrected, while taking the proximity exposure effect into account, are 0.2, 0.15, 0.1, 0.09, 0.07 and 0.05, as is shown in FIG. 21A. According to the correction table in FIG. 10, the quantities of exposure of the auxiliary exposure patterns for these areas are inversely proportional to their pattern densities:

0.2<0.15<0.1<0.09<0.07<0.05.

When the energy distribution on the line AA—AA in FIG. 21A due to exposure is indicated, as is shown in FIG. 21B the exposure energy for the pattern P30 is so distributed that it expands into its surrounding areas, as is indicated by 600 in FIG. 6, and the energy for the peripheral auxiliary exposure patterns is as indicated by 610. The distribution of the total energy involved is as indicated by 620.

As is apparent from these distributions, only for the pattern P30 is the pattern width $D_0$ is narrower than the actual pattern width according to the energy distribution 600. However, according to the distribution 620, which includes the energy for the auxiliary exposure pattern, the pattern width $D_1$ is equal to the actual pattern width, and a clearly defined pattern P30 can be formed.

As is described above, the auxiliary exposure pattern must be generated at gradually changed quantities of exposure for the areas enclosing the pattern P30, and to perform this process, many auxiliary exposure patterns should be generated and registered. This structure is not compatible with efficient data processing, which is the objective of the present invention.

In this embodiment, therefore, a block mask having a plurality of transmission holes is employed to provide a simplified auxiliary exposure pattern having a gradually changing quantity of exposure and to provide a smoother distribution of energy.

Figure 22:
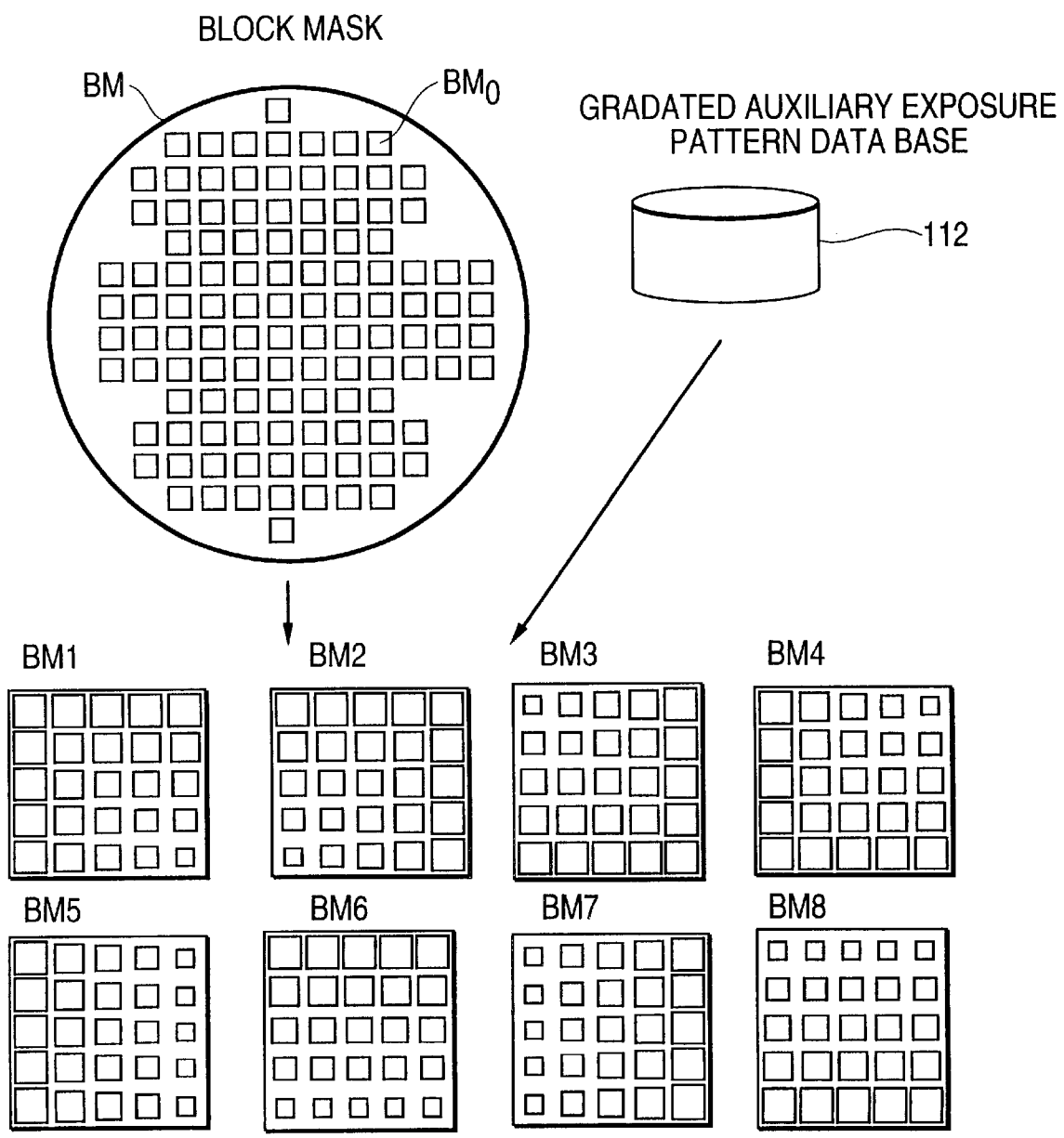
FIG. 22 is a diagram showing an example block mask for an auxiliary exposure pattern.

FIG. 22 is a diagram showing an example block mask used for an auxiliary exposure pattern. A plurality of block masks $BM_0$ are formed on a block mask substrate to obtain a block mask BM, which is used as the transmission mask 34 in FIG. 1. Transmission holes constituted by the combination of frequently employed exposure patterns are formed in the individual block masks $BM_0$. The pattern data for such block masks are stored in the block mask pattern file 112 in FIG. 2. In this embodiment, auxiliary exposure pattern data are also stored in the block mask pattern file 112.

Block masks $BM_1$ to $BM_8$ are shown in the lower half of the illustration in FIG. 22. While block mask $BM_1$ has a high transmission hole density at its upper left and a low transmission hole density at its lower right, and block mask $BM_2$ has a high transmission hole density at its upper right and a low transmission hole density at its lower left, block masks $BM_3$ and $BM_4$ have transmission hole densities which are the diagonal opposites of the first two masks, and block masks $BM_5$ to $BM_8$ each have a high transmission hole density along one side and a low transmission hole density along the opposite side.

When the block mask is employed, exposure of the complete or the partial block mask is performed using the same quantity of exposure (a product of the beam intensity and time). Therefore, since there is a gradation in the densities of the transmission holes in the block masks, an auxiliary exposure pattern having an arbitrary quantity of exposure distribution can be formed. In addition, since a set of block mask pattern data can be employed for a large region using the block masks, the efficiency of the data processing can be improved.

Figure 23:
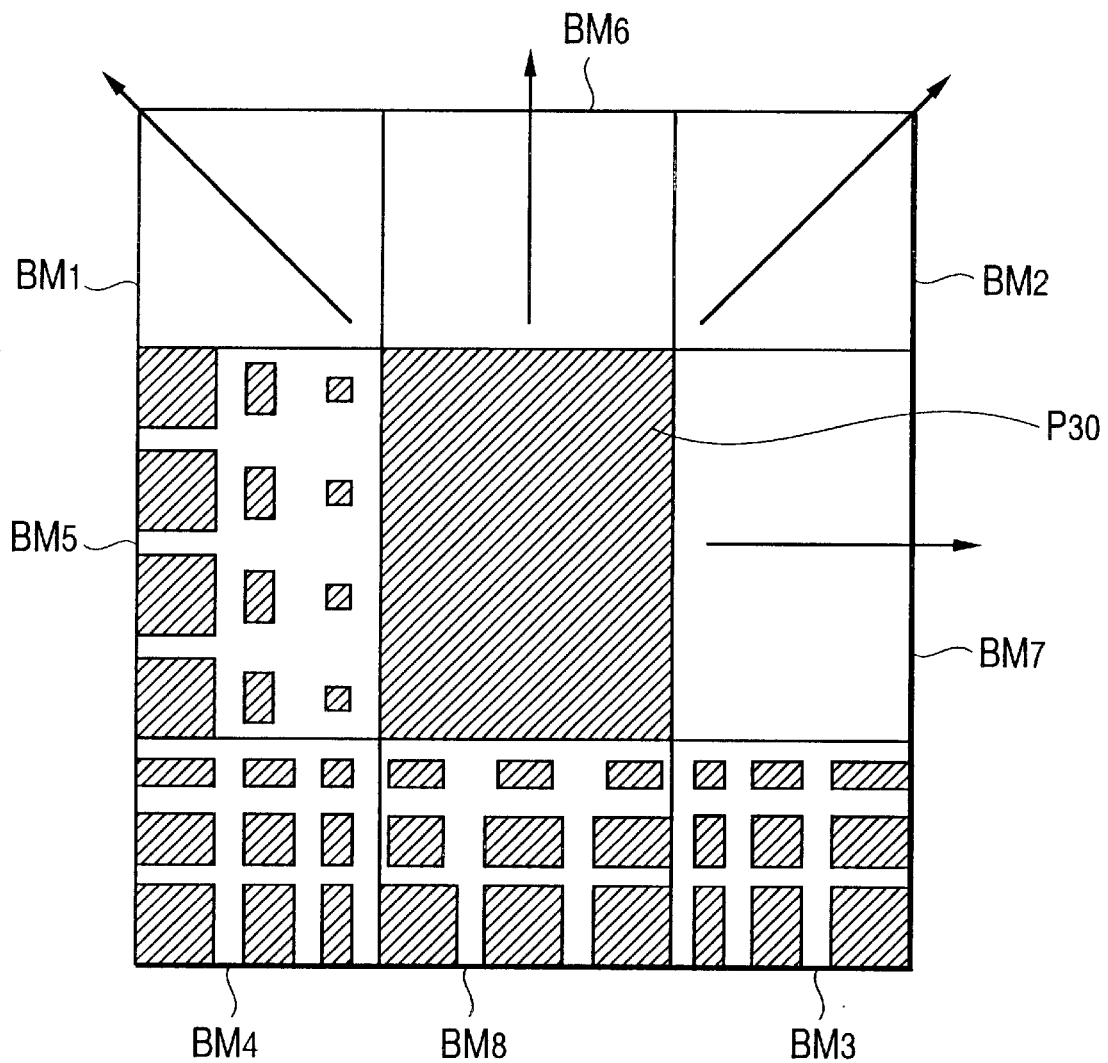
FIG. 23 is a diagram showing an example where an auxiliary exposure pattern of a block mask is employed.

FIG. 23 is a diagram illustrating an example where the auxiliary exposure patterns using the block masks is employed. Auxiliary exposure patterns using eight block masks $BM_1$ to $BM_8$ are arranged around the pattern P30. Since the transmission hole densities of these block masks are greater in the directions indicated by arrows, auxiliary exposure patterns having the gradually changing quantity of exposure distribution shown in FIG. 21 are formed. In addition, there are only eight auxiliary exposure patterns and this results in an improvement in the data processing efficiency. A smoother energy distribution can be provided for the auxiliary exposure patterns by employing the patterns of the individual block masks.

Figure 24:
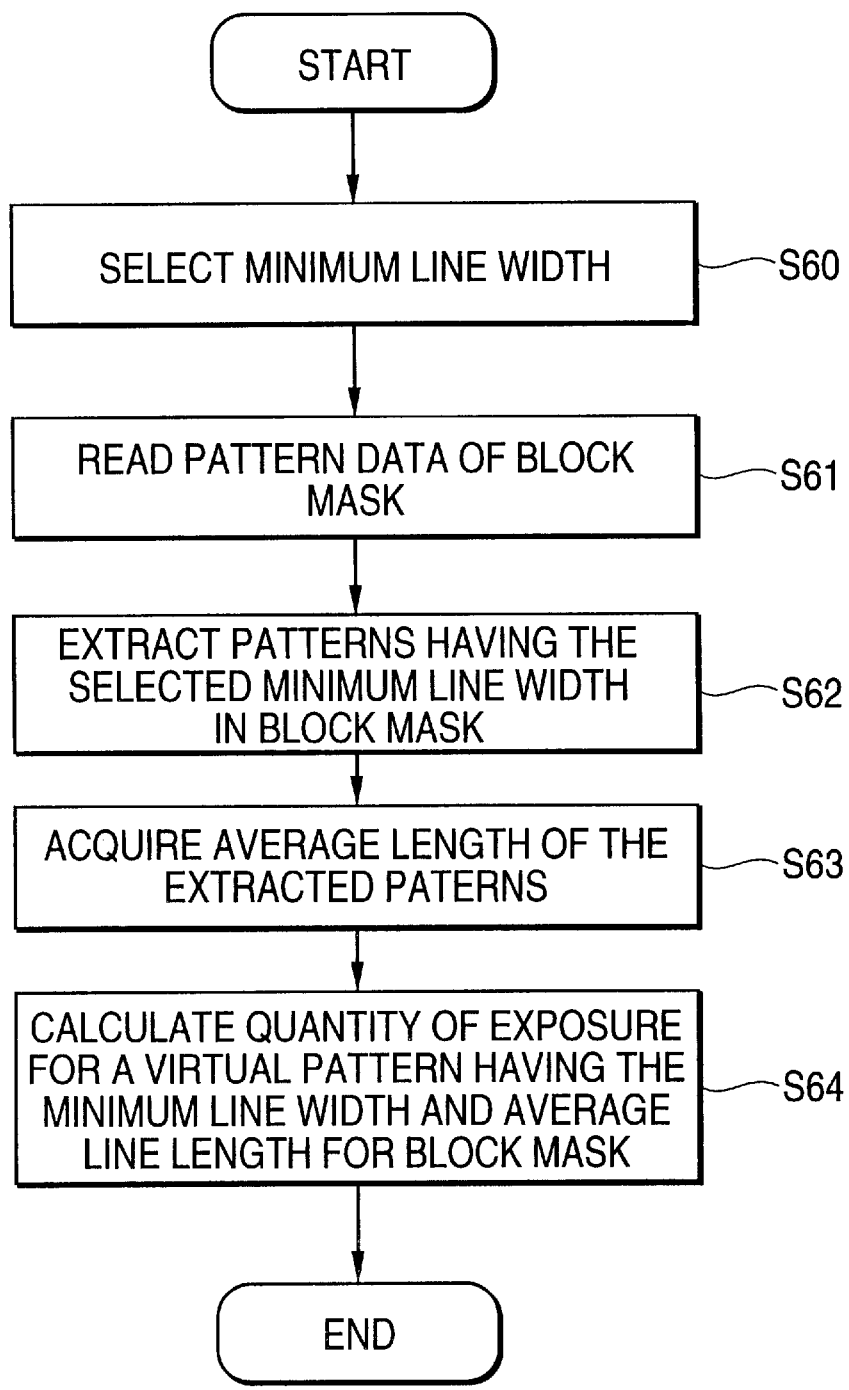
FIG. 24 is a flowchart showing the processing including the setting of the quantity of exposure for a block mask.

FIG. 24 is a flowchart for the processing including the setting of the exposure intensities of the block masks. The flowchart in FIG. 24 corresponds to steps S10 and S11 in FIG. 5. Since a plurality of patterns can be exposed at one time by using the block masks, the throughput of the exposure process can be increased. However, since the quantities of exposure are the same, an optimal quantity of exposure for each block mask should be set in accordance with the shape, the size and the thickness of the pattern of an individual block mask. Normally, an quantity of exposure enough for the smallest line width is set; however, sometimes there is a pattern which is narrower than a line width determined by a designer, or there is a long pattern or a short pattern although having a small line width. Therefore, it is difficult to determine the optimal quantity of exposure for each block mask.

In this embodiment, while taking the above problem into consideration, first, patterns having a selected smallest line width are extracted; second, the average length for the extracted patterns is acquired; and third, a virtual pattern having the smallest line width and the average length is employed to set the quantity of exposure for the block mask. For this setup, quantity of exposure calculation for an ordinary pattern while taking into account the forward beam scattering and rearward beam scattering is performed.

FIG. 25 is a diagram showing a minimum line width selection table for block masks. Designing an integration circuit is performed according to the minimum line width rule which corresponds to the process condition, etc., employed for fabrication. In this embodiment, therefore, the minimum line width as well as design data can be set. In other words, as is shown in the table in FIG. 25, an operator can select a minimum line width among line widths from 0.18 μm to 0.26 μm.

FIGS. 26A and 26B are diagrams showing example block masks. Since the 0.18 μm wide pattern on the block mask BM in FIG. 26A have oblique segments, on the block mask BM there are also 0.16 μm wide and 0.14 μm wide patterns in the oblique segments. When W1=0.18 μm is selected from the minimum line width selection table in FIG. 25, the smallest line width of the block mask BM in FIG. 26A is determined to be 0.18 μm, and these patterns are extracted. Therefore, the width of the 0.14 μm wide pattern in the oblique segment will not be determined to be the smallest, the assignment of an excessively high quantity of exposure is prevented, and an optimal quantity of exposure can be determined which conforms to the design rules.

An example block mask BM in FIG. 26B includes 0.40 μm wide and 0.80 μm wide patterns. In this case, when W1=0.18 μm is selected from the table in FIG. 25 as the smallest line width, a corresponding pattern is not detected. Therefore, in the example in FIG. 26B, 0.40 μm is determined to be the smallest line width on the block mask.

As is described above, according to the present invention, as shown in the flowchart in FIG. 24, the smallest line width which conforms to the design rules is selected from the table (S60), the pattern data in the block mask are read (S61), and patterns having the selected minimum line width are extracted from the block mask (S62). In this case, a pattern having a line width smaller than the selected width is not extracted.

Figure 27A:
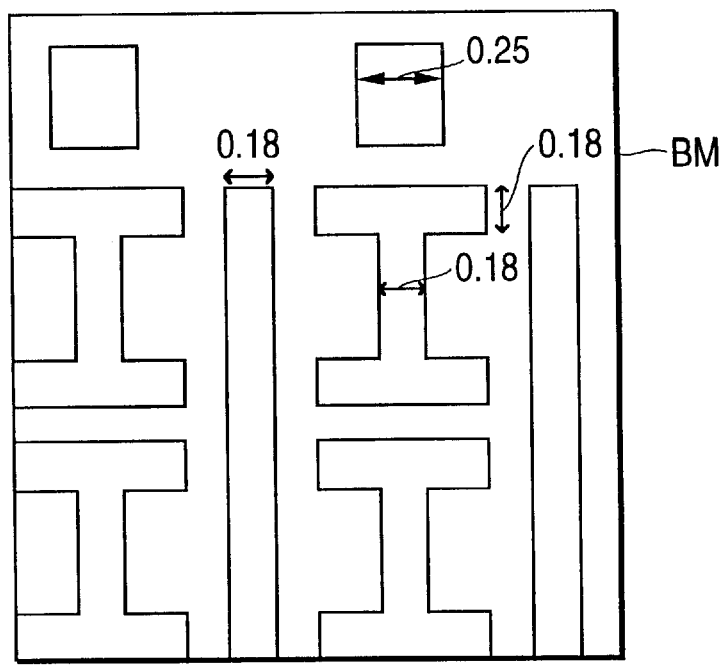
FIGS. 27A and 27B are diagrams for explaining the process for acquiring the average length of an extracted pattern.
Figure 27B:
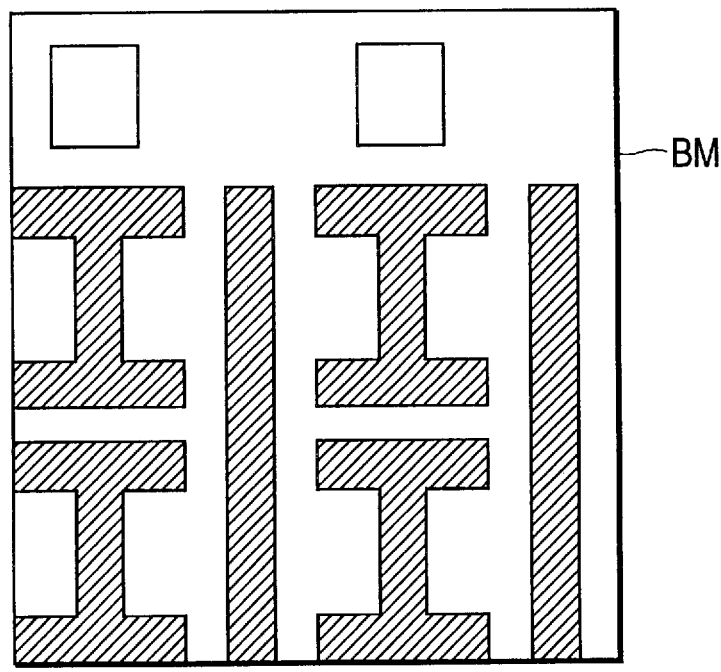

FIGS. 27A and 27B are diagrams for explaining the process at step S63 for calculating the average length of the extracted patterns. An example block mask BM in FIG. 27A has two 0.18 μm wide and 0.25 μm wide patterns. For this example, assume that 0.18 μm is selected from the table as the smallest line width. Then, as is shown by black portions in FIG. 27B, patterns having the smallest line width of 0.18 μm are extracted at step S62, and the average length of the extracted patterns is calculated thereafter.

In this manner, a virtual pattern is determined which has the selected smallest line width and the average length of the extracted patterns. The optimal quantity of exposure (exposure strength) Q is calculated by using the virtual pattern, while taking the forward scattering and the rearward scattering into account. The calculation of the quantity of exposure (exposure strength) is performed by using the following method.

When, for example, parameters A, B and C for irradiation with an quantity of exposure of 1 μC/cm² are obtained in advance, the actual quantity of exposure $Q_0$ for the individual patterns (horizontal $x_0$, vertical $y_0$) is calculated by equation 1.

$$Q_0 = \int_{x=0}^{x_0} \int_{y=0}^{y_0} \exp\left(-\frac{r^2}{A^2}\right) + B \cdot \exp\left(-\frac{r^2}{C^2}\right) \qquad \text{[Equation 1]}$$

where
r: distance
A, B and C: parameters
$Q_0$: calculated quantity of exposure.

In the first part of the equation the energy expended due to the forward scattering is shown, and in the last part, the energy expended due to rearward scattering is shown. The quantity of exposure $Q_0$ need only reach a level which exceeds a threshold level $Q_{th}$ at which the resist layer is developed.

Assuming that the optimal quantity of exposure, which is provided for a pattern having a specific size (e.g. 20 μm×20 μm) relative to the quantity of exposure $Q_{th}$, is $Q_1$ (reference quantity of exposure), the optimal quantity of exposure Q for a pattern (horizontal $x_0$, vertical $y_0$) relative to the reference quantity of exposure $Q_1$ is acquired by employing the relationship between the quantities of exposure $Q_0$ and $Q_{th}$. In this case, the reference quantity of exposure $Q_1$ is either increased or reduced at a ratio of the reciprocal of $Q_0$ in the above equation.

Figure 28:
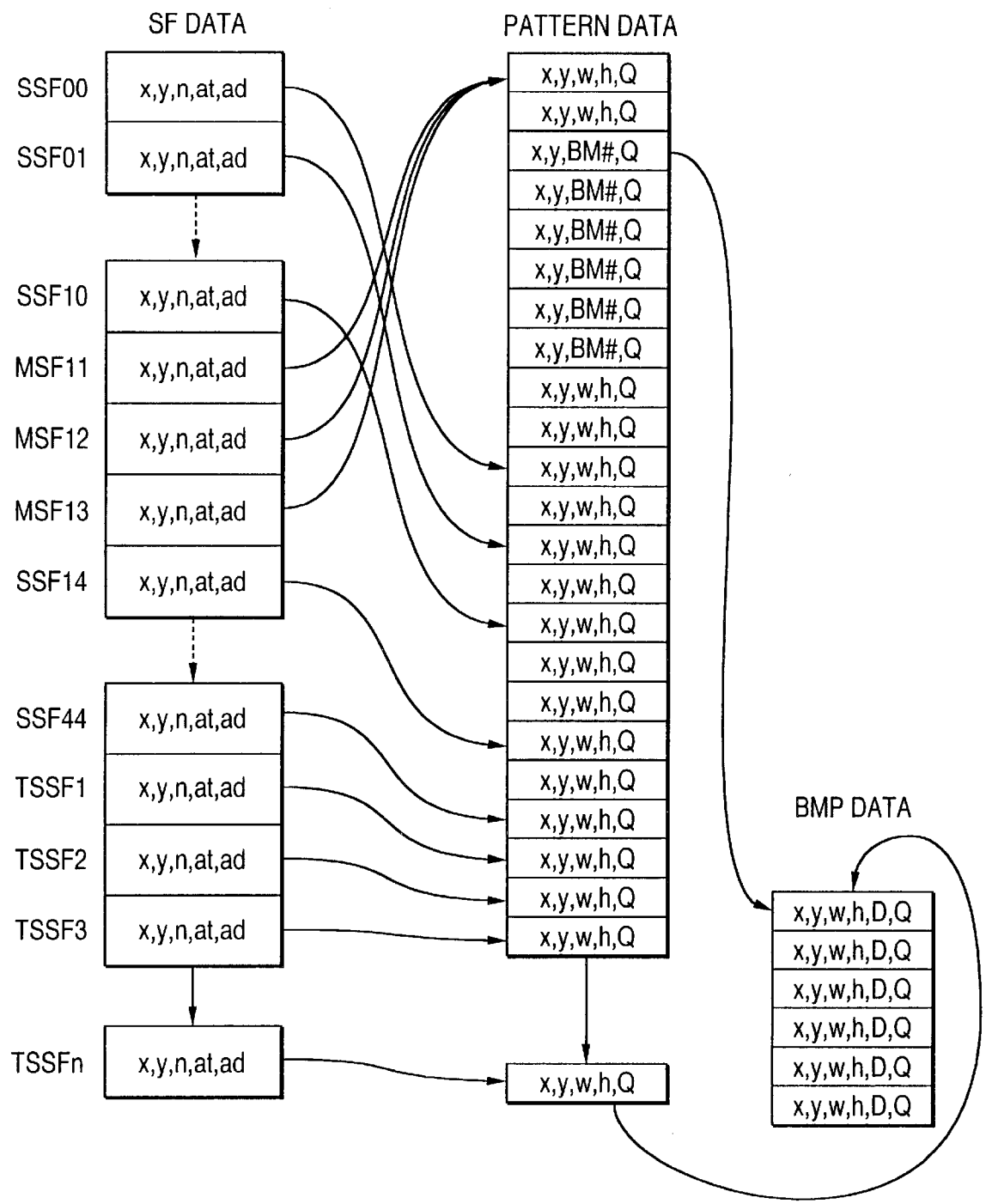
FIG. 28 is a diagram illustrating an example structure of exposure data for a block mask pattern.

FIG. 28 is a diagram showing an example structure for exposure data including those for block mask patterns. When block masks are included in the pattern data, not only the positional coordinates (x, y) and quantity of exposure (exposure strength) Q, but also block mask number BM# is provided instead of the width w and the height h of the pattern data. Then, the pattern data are linked with block mask pattern data corresponding to the block mask number BM#. The block mask pattern data contains the position coordinates (x, y), the width w and the height h, the pattern density D, and the quantity of exposure (exposure strength) Q for internally included patterns.

As is described above, according to the present invention, in the exposure method for performing the quantity of exposure correction processing, in which the pattern density for each area is corrected while taking the proximity exposure effect into account, and the quantity of exposure for the pattern is corrected or an auxiliary exposure pattern is additionally formed in accordance with the reviewed pattern density, the sizes of the areas to be generated in the sub-field can be varied in order to reduce the number of areas, and thus the data processing required for the quantity of exposure correction procedures can be performed more efficiently.

Further, in this invention, for the generation of variable areas, a larger area is produced by generating a mesh consisting of line segments which pass through the vertexes of a pattern and by connecting the line segments which have the same or substantially the same number of belonging patterns. Therefore, it is possible to generate a variable area, the location and the shape of which matches those of the pattern, and more efficient data processing for the creation of exposure data and more accurate processing for quantity of exposure correction can be performed.

In addition, in this invention, for the generation of a variable area, since adjacent areas having the same pattern densities are coupled together to form a large area, the number of areas can be reduced and more efficient data processing as is required for the quantity of exposure correction processing can be preformed.

In the present invention, since the quantity of exposure correction processing performed for area by area is distributed to a plurality of computers, highly integrated LSI pattern data can be converted into exposure data within a short period of time.

Furthermore, in the present invention, when the quantity of exposure for pattern is reduced during the quantity of exposure correction processing, the quantity of exposure for an auxiliary exposure pattern, which is to be generated in an area to which the above pattern belongs, is increased in accordance with the reduction rate for the quantity of exposure. Therefore, an enough quantity of exposure for an auxiliary exposure pattern can be set for the low pattern density portion of a pattern which belongs to a region having a high pattern density.

Further, in the present invention, block masks having a transmission hole pattern with a predetermined quantity of exposure distribution are employed to generate an auxiliary exposure pattern having a predetermined quantity of exposure distribution. Therefore, more accurate and only a small amount of auxiliary exposure pattern data need be generated. As a result, data processing which accompanies the quantity of exposure correction can be performed efficiently.

In addition, in the present invention, the average length of patterns having a selected, minimum line width is acquired before setting the quantity of exposure for the block mask. Thus, the minimum required quantity of exposure can be set in accordance with the smallest line width and the average length, so that the quantity of exposure for the block mask can be optimized.

What is claimed is:

1. A charged particle beam exposure method, wherein exposure data having exposure pattern data for each of a plurality of sub-fields in a main field is acquired from pattern data comprising pattern data for each of said sub-fields and a sample is exposed in accordance with said exposure data, comprising the steps of:
    (a) generating a plurality of areas having different shapes, in accordance with patterns in said sub-fields, and obtaining pattern densities in said areas;
    (b) correcting said pattern densities in accordance with pattern densities for areas surrounding said areas and with distances between said areas;
    (c) generating auxiliary exposure pattern in said area when said pattern density for said area is lower than a predetermined reference exposure density; and
    (d) exposing said sample in accordance with exposure data added data for said auxiliary exposure patterns to said pattern data.

2. A charged particle beam exposure method according to claim 1, wherein said step (a) includes a step of generating a plurality of first areas in said sub-field, of obtaining pattern densities for said first areas, and of combining together said first areas which are adjacent to each other and have substantially the same pattern densities so as to produce a second area.

3. A charged particle beam exposure method according to claim 1, wherein said step (a) includes a step of generating horizontal and vertical line segments passing through vertexes of patterns in said sub-field, of calculating the number of patterns located along said horizontal and vertical line segments, of combining said horizontal and vertical line segments which are adjacent and have substantially the same number of patterns, and of producing an area defined by the horizontal and vertical line segments provided by the combining.

4. A charged particle beam exposure method according to claim 1, wherein processes at said steps (b) and (c) are performed in parallel by a plurality of computers.

5. A charged particle beam exposure method, wherein exposure data having exposure pattern data for each of a plurality of sub-fields in a main field is acquired from pattern data comprising pattern data for each of said sub-fields and a sample is exposed in accordance with said exposure data, comprising the steps of:

(a) determining a quantity of exposure in accordance with a pattern shape of said pattern data;

(b) generating a plurality of areas having different shapes in accordance with patterns in said sub-fields, and obtaining pattern densities in said areas;

(c) correcting said pattern densities in accordance with pattern densities of areas surrounding said areas and distances between said areas;

(d) reducing said quantities of exposure for said pattern in said area when said pattern density of said area is greater than a predetermined reference exposure density, and generating auxiliary exposure pattern in said area when said pattern density of said area is lower than a predetermined reference exposure density, while said quantity of exposure for an auxiliary exposure pattern, which is generated in an area including said pattern having a reduced quantity of exposure, is set higher as the degree of the reduction is greater; and (e) exposing said sample in accordance with exposure data added data for said auxiliary exposure patterns to said pattern data.

6. A charged particle beam exposure method, wherein exposure data having exposure pattern data for each of a plurality of sub-fields in a main field is acquired from pattern data comprising pattern data for each of said sub-fields and a sample is exposed in accordance with said exposure data, comprising the steps of:

(a) generating a plurality of areas in said sub-fields and obtaining pattern densities in said areas;

(b) correcting said pattern densities in accordance with pattern densities for areas surrounding said areas and with distances between said areas;

(c) generating auxiliary exposure pattern in said area when said pattern density for said area is lower than a predetermined reference exposure density; and (d) exposing said sample in accordance with exposure data added data for said auxiliary exposure patterns to said pattern data, wherein said auxiliary exposure pattern is exposed using block masks whose transmission hole patterns have a predetermined distribution.

7. A charged particle beam exposure method according to claim 6, wherein the density of said transmission hole pattern of each of said block masks changes from one side to the opposite side.

8. A charged particle beam exposure method according to claim 6, wherein the density of said transmission hole pattern of each of said block masks changes from one vertex to the opposite vertex.

9. A charged particle beam exposure method, wherein an exposure sample is irradiated by a charged particle beam which passes through a block mask having a plurality of transmission hole patterns, comprising the steps of:

selecting a minimum line width for pattern data in said block mask;

determining said selected minimum line width to be a representative line width for said block mask when the smallest line width in pattern data in said block mask is smaller than said selected minimum line width, determining said smallest line width in said pattern data in said block mask to be said representative line width when said smallest line width in said pattern data is greater than said selected minimum line width, obtaining an average length of patterns having said representative line width, and setting, as a quantity of exposure for said block mask, a quantity of exposure which corresponds to a pattern having said representative line width and said average length; and irradiating to said exposure sample said charged particle beam having said determined quantity of exposure which passes through said block mask.

10. A charged particle beam exposure method, wherein exposure data having exposure pattern data for each of a plurality of sub-fields in a main field is acquired from pattern data for each of said sub-fields and a sample is exposed in accordance with said exposure data, comprising the steps of:

(a) determining an quantity of exposure in accordance with a pattern shape of said pattern data;

(b) generating a plurality of areas in said sub-fields, and obtaining pattern densities in said areas;

(c) correcting said pattern densities in accordance with pattern densities of areas surrounding said areas and distances between said areas;

(d) generating auxiliary exposure pattern in said area when said pattern density of said area is lower than a predetermined reference exposure density; and (e) exposing said sample in accordance with exposure data added data for said auxiliary exposure patterns to said pattern data, wherein said steps (c) and (b) being performed in parallel by a plurality of computers.

11. A charged particle beam exposure method, wherein exposure data having exposure pattern data for each of a plurality of sub-fields in a main field is acquired from pattern data for each of said sub-fields and a sample is exposed in accordance with said exposure data, comprising the steps of:

(a) generating a plurality of areas in said sub-fields and obtaining pattern densities in said areas;

(b) correcting said pattern densities in accordance with pattern densities for areas surrounding said areas and with distances between said areas;

(c) generating auxiliary exposure patterns in said area when said pattern density for said area is lower than a predetermined reference exposure density, and halting generation of said auxiliary exposure pattern for said area when there is no area having a predetermined pattern density surrounding to said area; and (d) exposing said sample in accordance with exposure data added data for said auxiliary exposure patterns to said pattern data.

12. A charged particle beam exposure apparatus, which employs pattern data for each of a plurality of sub-fields to acquire exposure data having exposure pattern data for each of said sub-fields in a main field, and which exposes a sample in accordance with said exposure data, comprising:

an exposure data creation unit for creating a plurality of areas having different shapes, in accordance with patterns in said sub-fields so as to obtain pattern densities in said areas, for correcting said pattern densities in accordance with pattern densities for areas surrounding said areas and with distances between said areas, for generating auxiliary exposure pattern in said area when said pattern density for said area is lower than a predetermined reference exposure density to obtain exposure data by adding data for said auxiliary exposure patterns to said pattern data, and for exposing said sample in accordance with said exposure data.

13. A charged particle beam exposure apparatus according to claim 12, wherein said exposure data creation unit generates a plurality of first areas in said sub-field, obtains pattern densities for said first areas, and combines together said first areas which are adjacent to each other and have substantially the same pattern densities so as to produce a second area.

14. A charged particle beam exposure apparatus according to claim 12, wherein said exposure data creation unit generates horizontal and vertical line segments passing through vertexes of a pattern in said sub-field, obtains the number of patterns located along said horizontal and vertical line segments, combines said horizontal and vertical line segments which are adjacent and have substantially the same number of patterns, and produces an area defined by the horizontal and vertical line segments provided by the combining.

* * * * *